United States Patent
Kuroda

(10) Patent No.: US 9,093,316 B2
(45) Date of Patent: Jul. 28, 2015

(54) SEMICONDUCTOR DEVICE AND METHOD OF MANUFACTURING THE SAME

(75) Inventor: Hideaki Kuroda, Kanagawa (JP)

(73) Assignee: Sony Corporation, Tokyo (JP)

( * ) Notice: Subject to any disclaimer, the term of this patent is extended or adjusted under 35 U.S.C. 154(b) by 387 days.

(21) Appl. No.: 13/475,365

(22) Filed: May 18, 2012

(65) Prior Publication Data

US 2012/0231620 A1 Sep. 13, 2012

Related U.S. Application Data

(62) Division of application No. 12/654,657, filed on Dec. 29, 2009, now Pat. No. 8,203,175.

(30) Foreign Application Priority Data

Jan. 22, 2009 (JP) ................. 2009-011691

(51) Int. Cl.
H01L 21/3205 (2006.01)
H01L 27/115 (2006.01)
H01L 21/74 (2006.01)
H01L 21/768 (2006.01)
H01L 23/48 (2006.01)
H01L 27/12 (2006.01)
H01L 27/22 (2006.01)
H01L 27/24 (2006.01)
H01L 21/8238 (2006.01)
H01L 45/00 (2006.01)

(52) U.S. Cl.
CPC .......... *H01L 27/11507* (2013.01); *H01L 21/74* (2013.01); *H01L 21/76895* (2013.01); *H01L 23/481* (2013.01); *H01L 27/1203* (2013.01); *H01L 27/228* (2013.01); *H01L 27/2436* (2013.01); *H01L 21/823814* (2013.01); *H01L 45/085* (2013.01); *H01L 45/1233* (2013.01); *H01L 45/146* (2013.01); *H01L 2924/0002* (2013.01); *H01L 2924/12044* (2013.01)

(58) Field of Classification Search
CPC .............. H01L 21/74; H01L 21/76895; H01L 21/823814; H01L 23/481; H01L 27/1203
USPC ..................... 257/E21.19; 438/586
See application file for complete search history.

(56) References Cited

U.S. PATENT DOCUMENTS

| | | | | |
|---|---|---|---|---|
| 4,505,799 | A * | 3/1985 | Baxter | 204/416 |
| 5,633,182 | A * | 5/1997 | Miyawaki et al. | 438/30 |
| 5,670,812 | A | 9/1997 | Adler et al. | |
| 6,734,477 | B2 | 5/2004 | Moise et al. | |
| 7,176,522 | B2 * | 2/2007 | Cheng et al. | 257/338 |
| 7,585,716 | B2 * | 9/2009 | Cheng | 438/183 |
| 7,626,200 | B2 * | 12/2009 | Tayanaka | 257/59 |
| 7,872,316 | B2 | 1/2011 | Iwata | |
| 8,674,360 | B2 * | 3/2014 | Okazaki | 257/57 |
| 2004/0224471 | A1 * | 11/2004 | Clevenger et al. | 438/305 |

FOREIGN PATENT DOCUMENTS

| | | |
|---|---|---|
| JP | 05-267563 | 10/1993 |
| JP | 2004-079645 | 3/2004 |

* cited by examiner

*Primary Examiner* — Colleen A Matthews
*Assistant Examiner* — Colleen E Snow
(74) *Attorney, Agent, or Firm* — Fishman Stewart Yamaguchi PLLC

(57) ABSTRACT

A semiconductor device includes: diffusion layers formed at the front surface of a substrate; low-resistance parts formed at the front surfaces of the diffusion layers so as to have resistance lower than the diffusion layer; and rear contact electrodes passing through the substrate from the rear surface of the substrate to be connected to the low-resistance parts through the diffusion layers.

18 Claims, 16 Drawing Sheets

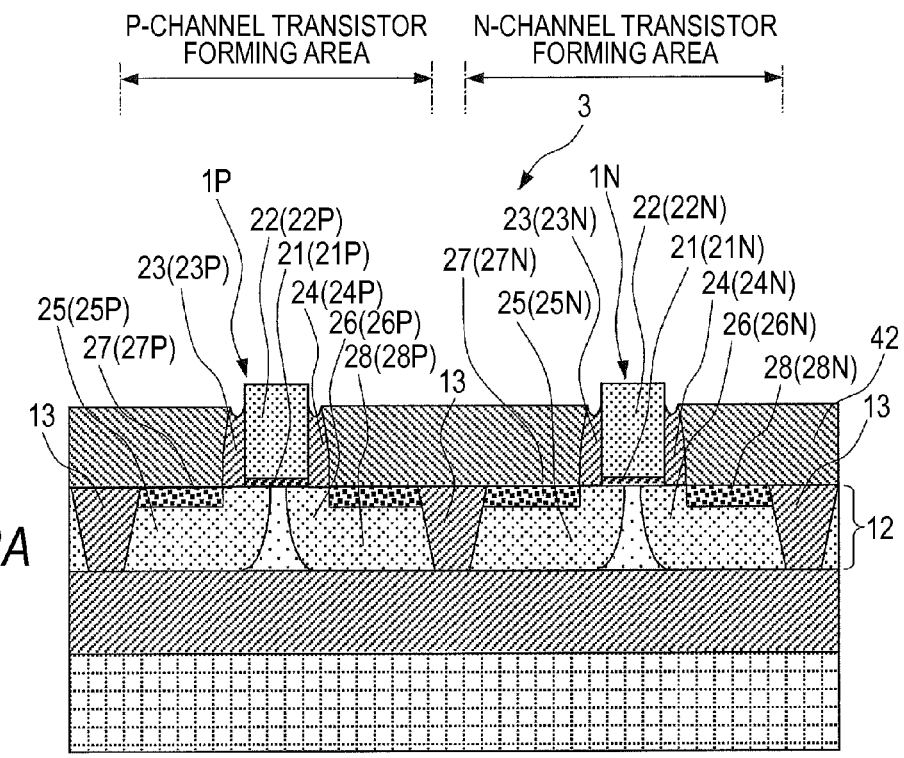
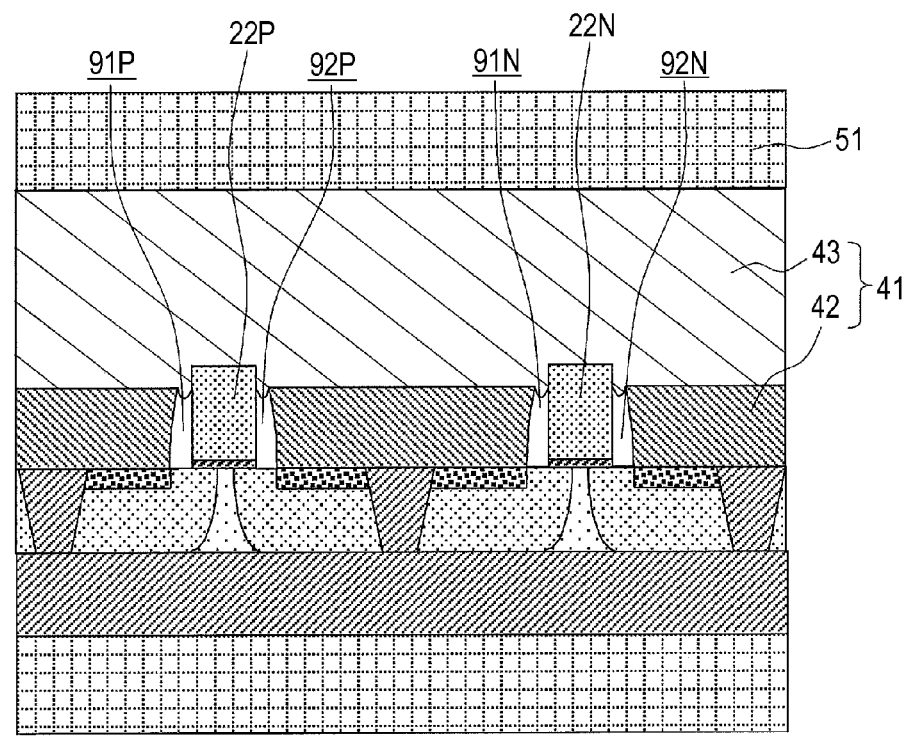

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

2. Description of the Related Art

A distance between a contact electrode and a gate electrode is reduced in accordance with scaling, and a significant increase in parasitic capacitance between the gate electrode and the contact electrode causes a significant increase in parasitic capacitance of the gate electrode, and causes degradation of a circuit operation speed and an increase in load capacitance, which lead to an increase in power consumption.

As the means for solving this problem, a gate electrode is formed at the front surface of an active area layer through a gate insulating film, and a source and a drain are formed at the active area layer on both sides of the gate electrode. A device structure and a method of manufacturing the same are suggested in which a contact electrode is provided at the rear surface of the active area layer to be connected to the rear surface of the source/drain (for example, see JP-A-2004-079645).

With scaling and an increase in the size of a system, the number of interconnect layers rapidly increases. For this reason, deterioration in yield or interconnect delay becomes problematic.

As the means for solving this problem, a so-called rear contact electrode and a rear interconnect are used in combination, thereby improving the utility of interconnects and achieving reduction in the number of interconnect layers and improvement in the integration (for example, see JP-A-05-267563).

In the above-described rear contact structure, the contact electrode is connected directly to the diffusion layer. Generally, when the contact electrode is connected from the front surface of the diffusion layer, a low-resistance layer such as a silicide layer is formed at the front surface of the diffusion layer, and the contact electrode is connected to the low-resistance layer, thereby reducing contact resistance. However, it is difficult to form a low-resistance layer such as a silicide layer at the rear surface of the diffusion layer, so the rear contact electrode is inevitably connected directly to the diffusion layer. This causes an increase in contact resistance and degradation in operation speed.

That is, the existing rear contact electrode and rear interconnect allows reduction in parasitic capacitance, but contact resistance between the rear contact electrode and the diffusion layer increases, deterioration in performance of a MOSFET or a variation in performance increases, which leads to deterioration in performance of a semiconductor device.

This is because an impurity concentration of the diffusion layer formed at a silicon layer in contact with a buried oxide layer (BOX) in an SOI substrate silicon layer decreases in a depth direction (rear direction) rather than the front surface due to the introduction of an impurity by ion implantation from the front surface of the silicon layer or the like.

In order to increase an impurity concentration at the interface of the buried oxide layer, it is necessary to increase ion implantation energy or to expand heat treatment after ion implantation. However, when this happens, a short channel effect of MOSFET characteristics increases, and deterioration in performance and a variation in performance increases.

Further, when a front interconnect is used, with the progress of miniaturization, the distance between the gate electrode and the contact electrode becomes closer. For this reason, parasitic capacitance between the gate electrode and the contact electrode or the diffusion layer relatively increases, and performance of a semiconductor device is deteriorated.

SUMMARY OF THE INVENTION

A problem exists in that contact resistance between the rear contact electrode and the diffusion layer increases, and performance of the MOSFET is deteriorated or a variation in performance increases, which leads to deterioration in performance of a semiconductor device.

Thus, it is desirable to reduce contact resistance between a rear contact electrode and a diffusion layer, thereby improving an operation speed of a semiconductor device.

An embodiment of the invention provides a semiconductor device. The semiconductor layer includes diffusion layers formed at the front surface of a substrate, low-resistance parts formed at the front surfaces of the diffusion layers so as to have resistance lower than the diffusion layers, and rear contact electrodes passing through the substrate from the rear surface of the substrate to be connected to the low-resistance parts through the diffusion layers.

With this semiconductor device, the rear contact electrodes are provided so as to pass through the substrate from the rear surface of the substrate to be connected the low-resistance parts through the diffusion layers. For this reason, contact resistance between the rear contact electrodes formed at the rear surface of the diffusion layers and the diffusion layers is reduced. That is, contact resistance between the rear contact electrodes and the diffusion layers is identical to contact resistance between front contact electrodes connected to low-resistance parts formed at the front surfaces of the diffusion layers from the front surface and the diffusion layers.

Another embodiment of the invention provides a method of manufacturing a semiconductor device. The method includes the steps of forming a gate electrode on a silicon layer of an SOI substrate, in which the silicon layer is formed on a first support substrate through an insulating layer, through a gate insulating film, and forming diffusion layers in the silicon layer on both sides of the gate electrode so as to form a transistor, forming low-resistance parts having resistance lower than the diffusion layers at the front surfaces of the diffusion layers, forming a second support substrate on the silicon layer through an insulating film covering the transistor, and removing the first support substrate and the insulating layer, and forming an insulating interlayer on the silicon layer and forming rear contact electrodes in the insulating interlayer and the silicon layer to be connected to the low-resistance parts.

With this method of manufacturing the semiconductor device, the rear contact electrodes are formed so as to pass through the substrate from the rear surface of the substrate to be connected to the low-resistance parts through the diffusion layers. For this reason, contact resistance between the rear contact electrodes formed at the rear surface of the diffusion layers and the diffusion layers is reduced. That is, contact resistance between the rear contact electrodes and the diffusion layers is identical to contact resistance between front contact electrodes connected to low-resistance parts formed at the front surfaces of the diffusion layers from the front surface and the diffusion layers.

According to the semiconductor device of the embodiment of the invention, contact resistance between the rear contact electrodes and the diffusion layers is reduced. Therefore, the operation speed of the semiconductor device can be improved, and as a result, a high-performance semiconductor device can be provided.

According to the method of manufacturing a semiconductor device of the embodiment of the invention, contact resistance between the rear contact electrodes and the diffusion layers is reduced. Therefore, the operation speed of the semiconductor device can be improved, and as a result, a high-performance semiconductor device can be provided.

BRIEF DESCRIPTION OF THE DRAWINGS

FIGS. 13A and 13B are process sectional views showing a third example of the method of manufacturing a semiconductor device according to the third embodiment of the invention.

DETAILED DESCRIPTION OF THE INVENTION

Hereinafter, a best mode for carrying out the invention (hereinafter, referred to as an embodiment) will be described.

1. First Embodiment

[First Example of Configuration of Semiconductor Device]

A first example of the configuration of a semiconductor device according to a first embodiment of the invention will be described with reference to a schematic sectional view of FIG. 1.

Figure 1:
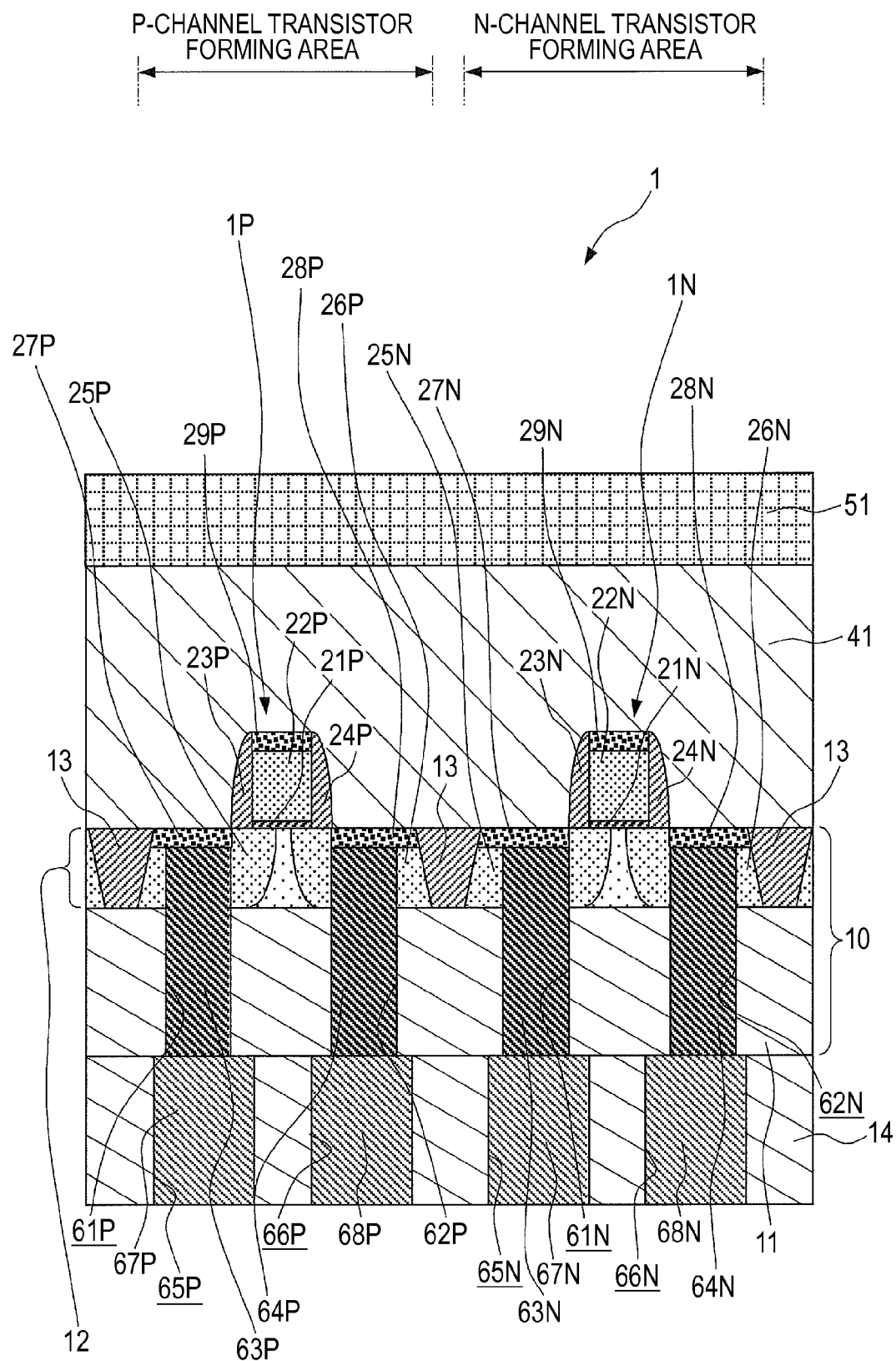
FIG. 1 is a schematic sectional view showing a first example of the configuration of a semiconductor device according to a first embodiment of the invention.

As shown in FIG. 1, a substrate 10 has a semiconductor area 12 formed on a first insulating film 11. The first insulating film 11 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a P-channel transistor forming area and an N-channel transistor forming area from each other.

A P-channel transistor 1P is formed in the semiconductor area 12 of the PMOS transistor forming area, and an N-channel transistor 1N is formed in the semiconductor area 12 of the NMOS transistor forming area.

Hereinafter, the details will be described.

A gate electrode 22P is formed on the P-channel transistor forming area of the semiconductor area 12 through a gate insulating film 21P.

The gate insulating film 21P is formed of, for example, a so-called high-dielectric-constant (High-k) film of hafnium oxide ($HfO_2$), hafnium nitride silicate (HfSiON), zirconium oxide ($ZrO_2$), zirconium nitride silicate (ZrSiON), or the like. Alternatively, the gate insulating film 21P is formed of a composite film of a thermal oxynitride film and the high-dielectric-constant film.

The gate electrode 22P is made of, for example, polysilicon. Alternatively, the gate electrode 22P is made of, titanium nitride (TiN), tantalum carbide (TaC), tungsten (W), or the like.

Sidewalls 23P and 24P are formed at the sidewalls of the gate electrode 22P. The sidewalls 23P and 24P are made of, for example, silicon oxide ($SiO_2$), silicon nitride (SiN), silicon oxynitride (SiON), or the like. Alternatively, the sidewalls 23P and 24P are formed of composite films of these materials.

Diffusion layers 25P and 26P are formed in the semiconductor area 12 on both sides of the gate electrode 22P. The diffusion layers 25P and 26P are of p type and form source and drain areas. The semiconductor area 12 between the diffusion layers 25P and 26P forms a channel area.

Low-resistance parts 27P and 28P are formed at the front surfaces of the diffusion layers 25P and 26P so as to have resistance (electrical resistance) lower than the diffusion layers 25P and 26P. The low-resistance parts 27P and 28P are formed of, for example, silicide layers. The silicide layers are made of, for example, metal silicide of cobalt (Co), nickel (Ni), platinum (Pt), tantalum (Ta), titanium (Ti), or the like.

When the gate electrode 22P is made of polysilicon, a low-resistance part 29P is formed at the upper part of the gate electrode 22P. The low-resistance part 29P is formed of the same silicide layer as described above.

In this way, the P-channel transistor 1P is formed in the semiconductor area 12.

A gate electrode 22N is formed on the N-channel transistor forming area of the semiconductor area 12 through a gate insulating film 21N.

The gate insulating film 21N is formed of, for example, a so-called high-dielectric-constant (High-k) film of hafnium oxide ($HfO_2$), hafnium nitride silicate (HfSiON), zirconium oxide ($ZrO_2$), zirconium nitride silicate (ZrSiON), or the like. Alternatively, the gate insulating film 21N is formed of a composite film of a thermal oxynitride film and the high-dielectric-constant film.

The gate electrode 22N is made of, for example, polysilicon. Alternatively, the gate electrode 22P is made of, titanium nitride (TiN), tantalum carbide (TaC), tungsten (W), or the like.

Sidewalls 23N and 24N are formed at the sidewalls of the gate electrode 22N. The sidewalls 23P and 24P are made of, for example, silicon oxide ($SiO_2$), silicon nitride, silicon oxynitride, or the like. Alternatively, the sidewalls 23P and 24P are formed of composite films of these materials.

Diffusion layers 25N and 26N are formed in the semiconductor area 12 on both sides of the gate electrode 22N. The diffusion layers 25N and 26N are of N type and form source and drain areas. The semiconductor area 12 between the diffusion layers 25N and 26N forms a channel area.

Low-resistance parts 27N and 28N are formed at the front surfaces of the diffusion layers 25N and 26N so as to have resistance (electrical resistance) lower than the diffusion layers 25N and 26N. The low-resistance parts 27N and 28N are formed of, for example, silicide layers. The silicide layers made of, for example, metal silicide of cobalt (Co), nickel (Ni), platinum (Pt), tantalum (Ta), titanium (Ti), or the like.

When the gate electrode 22N is made of polysilicon, a low-resistance part 29N is formed at the upper part of the gate electrode 22N. The low-resistance part 29N is formed of the same silicide layer as described above.

In this way, the N-channel transistor 1N is formed in the semiconductor area 12.

As described above, the semiconductor device 1 has the P-channel transistor 1P and the N-channel transistor 1N.

The substrate 10 in which the P-channel transistor 1P and the N-channel transistor 1N are formed has a first insulating film 11 as an insulating layer and the semiconductor area 12 formed at the top surface of the first insulating film 11. Therefore, the semiconductor area 12 is substantially equivalent to an SOI layer of an SOI substrate. For this reason, the P-channel transistor 1P and the N-channel transistor 1N formed in the semiconductor area 12 may be completely depleted transistors.

The semiconductor device 1 may have one of the transistors.

An insulating interlayer 41 is formed on the semiconductor area 12 so as to cover the semiconductor device 1. The insulating interlayer 41 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the insulating interlayer 41 is formed of an insulating film, such as an organic insulating film or the like, made of a material for an insulating interlayer of a typical semiconductor device. The surface of the insulating interlayer 41 is planarized.

A support substrate 51 is formed on the insulating interlayer 41. Examples of the support substrate 51 include a silicon substrate, a glass substrate, a plastic substrate, and the like.

Contact holes 61P and 62P are formed in the first insulating film 11 so as to communicate with the diffusion layers 25P and 26P, respectively. The contact holes 61P and 62P respectively pass through the diffusion layers 25P and 26P and reach the rear surfaces of the low-resistance parts 27P and 28P. Rear contact electrodes 63P and 64P are respectively formed in the contact holes 61P and 62P and connected to the rear surfaces of the low-resistance parts 27P and 28P. The rear contact electrodes 63P and 64P are respectively formed by filling the contact holes 61P and 62P with metal materials, for example, titanium (Ti), titanium nitride (TiN), tantalum (Ta), tantalum nitride (TaN), tungsten (W), copper (Cu), or the like.

Similarly, contact holes 61N and 62N are formed in the first insulating film 11 so as to communicate with the diffusion layers 25N and 26N, respectively. The contact holes 61N and 62N respectively pass through the diffusion layers 25N and 26N and reach the rear surfaces of the low-resistance parts 27N and 28N. Rear contact electrodes 63N and 64N are respectively formed in the contact holes 61N and 62N and connected to the rear surfaces of the low-resistance parts 27N and 28N. The rear contact electrodes 63N and 64N are respectively formed by filling the contact holes 61N and 62N with metal materials, for example, titanium (Ti), titanium nitride (TiN), tantalum (Ta), tantalum nitride (TaN), tungsten (W), copper (Cu), or the like.

A second insulating film 14 is formed at the first insulating film 11. The second insulating film 14 is formed of, for example, a silicon nitride (SiN) film, silicon oxide ($SiO_2$) film, a silicon oxycarbide (SiOC) film, a silicon oxycarbonitride (SiOCN) film, or a composite film thereof. Alternatively, the second insulating film 14 is formed of an insulating film, such as an organic insulating film or the like, made of a material for an insulating interlayer of a typical semiconductor device.

Interconnect grooves 65P and 66P are formed in the second insulating film 14 so as to communicate with the rear contact electrodes 63P and 64P, respectively. The interconnect grooves 65P and 66P respectively reach the rear contact electrodes 63P and 64P. Interconnects 67P and 68P are respectively formed in the interconnect grooves 65P and 66P and connected to the rear contact electrodes 63P and 64P. The interconnects 67P and 68P are respectively formed by filling the interconnect grooves 65P and 66P with metal materials, for example, titanium (Ti), titanium nitride (TiN), tantalum (Ta), tantalum nitride (TaN), ruthenium (Ru), copper (Cu) or the like, or composite films thereof.

Similarly, interconnect grooves 65N and 66N are formed in the second insulating film 14 so as to communicate with the rear contact electrodes 63N and 64N, respectively. The interconnect grooves 65N and 66N respectively reach the rear contact electrodes 63N and 64N. Interconnects 67N and 68N are respectively formed in the interconnect grooves 65N and 66N and connected to the rear contact electrodes 63N and 64N. The interconnects 67N and 68N are respectively formed by filling the interconnect grooves 65N and 66N with metal materials, for example, titanium (Ti), titanium nitride (TiN), tantalum (Ta), tantalum nitride (TaN), ruthenium (Ru), copper (Cu) or the like, or composite films thereof.

Though not shown, an N-th (where N≥2) interconnect and an (N−1)th rear contact electrode connecting the N-th layered interconnect and an (N−1)th interconnect may be formed. That is, the interconnects may be formed in the form of multilayer interconnects.

In the semiconductor device 1, the rear contact electrodes 63P, 64P, 63N, and 64N respectively pass through the diffusion layers 25P, 26P, 25N, and 26N and are connected directly to the low-resistance parts 27P, 28P, 27N, and 28N. Therefore, for example, the contact resistance value between the rear contact electrode 63P and the diffusion layer 25P is reduced. Similarly, the contact resistance values between the rear contact electrodes 64P, 63N, and 64N and the diffusion layers 26P, 25N, and 26N are reduced. That is, the contact resistance values between the rear contact electrodes 63P, 64P, 63N, and 64N and the diffusion layers 25P, 26P, 25N, and 26N are identical to the contact resistance values between front contact electrodes (not shown) connected to the low-resistance parts 27P, 28P, 27N, and 28N formed at the front surfaces of the diffusion layers 25P, 26P, 25N, and 26N from the front surface and the diffusion layers 25P, 26P, 25N, and 26N.

Therefore, the contact electrodes that were formed on the gate electrodes 22P and 22N in the related art will not be formed, so parasitic capacitance between the gate electrodes 22P and 22N and the rear contact electrodes 63P, 64P, 63N, and 64N is reduced.

Even though the distance between the gate electrodes 22P and 22N and the contact electrodes is reduced in terms of planar layout with element miniaturization, the gate electrodes 22P and 22N can be reliably insulated from the rear contact electrodes 63P, 64P, 63N, and 64N.

The miniaturization of the contact electrodes are facilitated with a small aspect ratio of the rear contact electrodes 63P, 64P, 63N, and 64N.

Even when a so-called stress liner film (not shown) is provided on the transistor so as to improve mobility, the stress liner film is not disconnected by the contact electrodes, so loss of a stress effect of the stress liner film is small. The stress liner film (CSIL: Channel Stress Induced Liner) is typically formed of a silicon nitride film having tensile stress or compressive stress.

[Second Example of Configuration of Semiconductor Device]

Next, a second example of the configuration of the semiconductor device according to the first embodiment of the invention will be described with reference to a schematic sectional view of FIG. 2. A semiconductor device (transistor) shown in FIG. 2 may be the P-channel transistor 1P or the N-channel transistor 1N described above. That is, a shared contact electrode connected to a gate electrode and a diffusion layer is provided.

Figure 2:
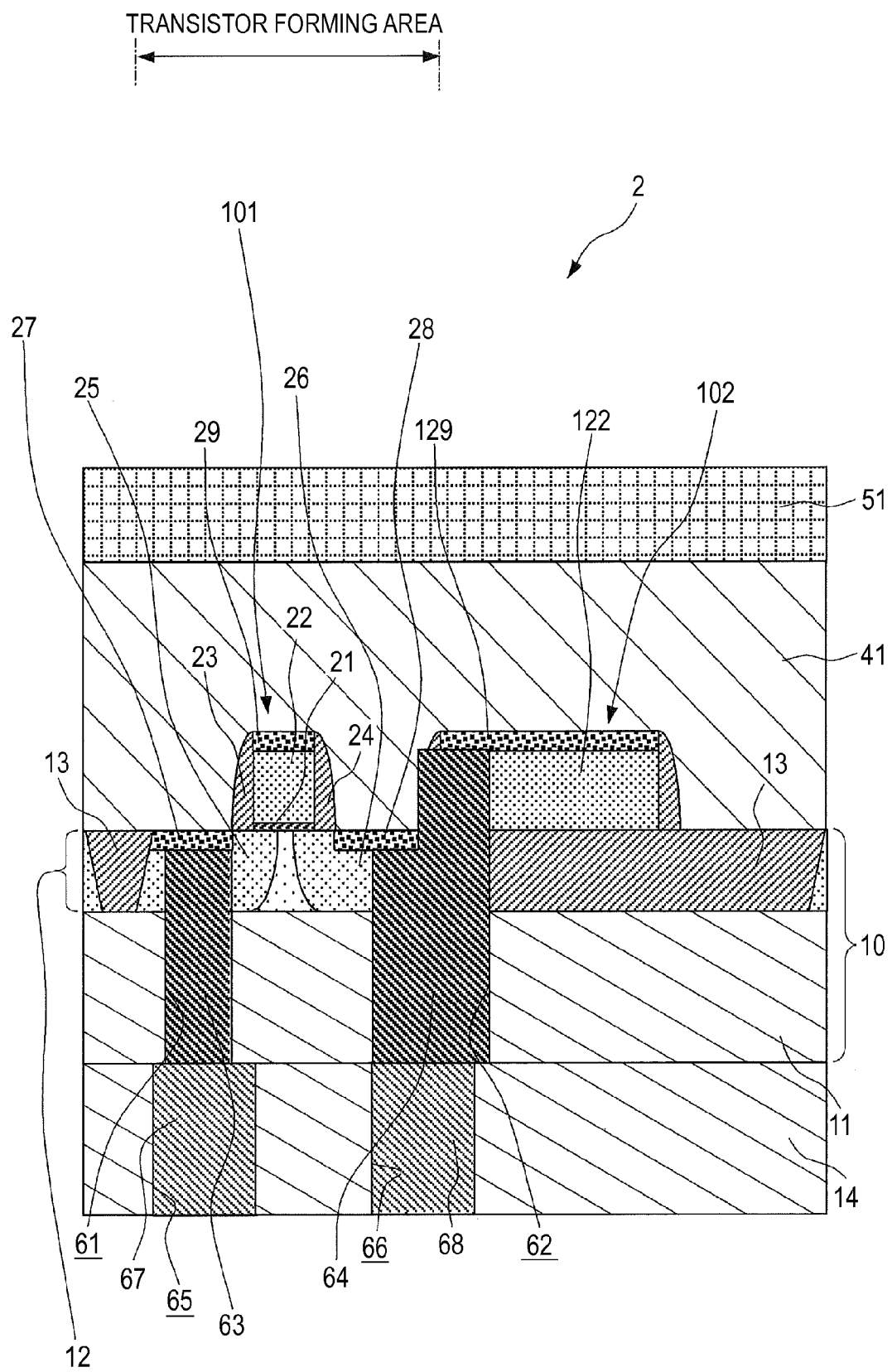
FIG. 2 is a schematic sectional view showing a second example of the configuration of the semiconductor device according to the first embodiment of the invention.

As shown in FIG. 2, a substrate 10 has a semiconductor area 12 formed on the first insulating film 11. The first insulating film 11 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a transistor forming area.

A first transistor 101, for example, a P-channel transistor or an N-channel transistor is formed in the semiconductor area 12 of the transistor forming area.

Hereinafter, the details will be described.

A gate electrode 22 is formed on the transistor forming area of the semiconductor area 12 through a gate insulating film 21.

The gate insulating film 21 is formed of, for example, a so-called high-dielectric-constant (High-k) film of hafnium oxide (HfO$_2$), hafnium nitride silicate (HfSiON), zirconium oxide (ZrO$_2$), zirconium nitride silicate (ZrSiON), or the like. Alternatively, the gate insulating film 21 is formed of a composite film of a thermal oxynitride film and the high-dielectric-constant film.

The gate electrode 22 is made of, for example, polysilicon.

Sidewalls 23 and 24 are formed at the sidewalls of the gate electrode 22. The sidewalls 23 and 24 are made of, for example, silicon oxide (SiO$_2$), silicon nitride (SiN), silicon oxynitride (SiON), or the like. Alternatively, the sidewalls 23 and 24 are formed of composite films of these materials.

Diffusion layers 25 and 26 are formed in the semiconductor area 12 on both sides of the gate electrode 22. The diffusion layers 25 and 26 are of P type in the case of a P-channel transistor or of N type in the case of an N-channel transistor, and form source and drain areas. The semiconductor area 12 between the diffusion layers 25 and 26 forms a channel area.

Low-resistance parts 27 and 28 are respectively formed at the front surfaces of the diffusion layers 25 and 26 so as to have resistance (electrical resistance) lower than the diffusion layers 25 and 26. The low-resistance parts 27 and 28 are formed of, for example, silicide layers. The silicide layers are made of, for example, metal silicide of cobalt (Co), nickel (Ni), platinum (Pt), tantalum (Ta), titanium (Ti), or the like.

A low-resistance part 29 is formed at the upper part of the gate electrode 22. The low-resistance part 29 is formed of the same silicide layer as described above.

In this way, the first transistor 101 is formed in the semiconductor area 12.

A gate electrode 122 of a second transistor 102 different from the first transistor 101 is formed so as to extend on the element isolation area 13. The gate electrode 122 is made of polysilicon, and a low-resistance part 129 is formed on the gate electrode 122. The low-resistance part 129 is formed of the same silicide layer as described above.

An insulating interlayer 41 is formed on the semiconductor area 12 so as to cover the semiconductor device 2 (first and second transistors 101 and 102). The insulating interlayer 41 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the insulating interlayer 41 is formed of an insulating film, such as an organic insulating film or the like, made of a material for an insulating interlayer of a typical semiconductor device. The surface of the insulating interlayer 41 is planarized.

A support substrate 51 is formed on the insulating interlayer 41. Examples of the support substrate 51 include a silicon substrate, a glass substrate, a plastic substrate, and the like.

Contact holes 61 and 62 are formed in the first insulating film 11 so as to communicate with the diffusion layers 25 and 26, respectively. The contact holes 61 and 62 respectively pass through the diffusion layers 25 and 26 and reach the rear surfaces of the low-resistance parts 27 and 28. Of these, the contact hole 62 further reaches the rear surface of the low-resistance part 129 of the gate electrode 122. Rear contact electrodes 63 and 64 are respectively formed in the contact holes 61 and 62 and connected to the rear surfaces of the low-resistance parts 27 and 28. Of these, the rear contact electrode 64 is connected to the low-resistance part 28 of the diffusion layer 26 and the low-resistance part 129 of the gate electrode 122. The rear contact electrodes 63 and 64 are respectively formed by filling the contact holes 61 and 62 with metal materials, for example, titanium (Ti), titanium nitride (TiN), tantalum (Ta), tantalum nitride (TaN), tungsten (W), copper (Cu), or the like.

A second insulating film 14 is formed at the first insulating film 11. The second insulating film 14 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the second insulating film 14 is formed of an insulating film, such as an organic insulating film or the like, made of a material for an insulating interlayer of a typical semiconductor device.

Interconnect grooves 65 and 66 are formed in the second insulating film 14 so as to communicate with the rear contact electrodes 63 and 64, respectively. The interconnect grooves 65 and 66 respectively reach the rear contact electrodes 63 and 64. Interconnects 67 and 68 are respectively formed in the interconnect grooves 65 and 66 and connected to the rear contact electrodes 63 and 64. The interconnects 67 and 68 are respectively formed by filling the interconnect grooves 65 and 66 with metal materials, for example, titanium (Ti), titanium nitride (TiN), tantalum (Ta), tantalum nitride (TaN), ruthenium (Ru), copper (Cu) or the like, or composite films thereof.

Though not shown, an N-th (where N≥2) interconnect and an (N−1)th rear contact electrode connecting the N-th layered interconnect and an (N−1)th interconnect may be formed. That is, the interconnect may be formed in the form of a multilayer interconnect.

The semiconductor device 2 is applied to a so-called shared contact electrode structure. Therefore, even in the shared contact electrode structure, the same advantages as the semiconductor device 1 are obtained. Similarly to the semiconductor device 1, the semiconductor device 2 may have completely depleted transistors.

That is, similarly to the semiconductor device 1, in the semiconductor device 2, the rear contact electrodes 63 and 64 are respectively connected directly to the low-resistance parts 27 and 28 through the diffusion layers 25 and 26. From this, for example, the contact resistance value between the rear contact electrode 63 and the diffusion layer 25 is reduced. Similarly, the contact resistance value between the rear contact electrode 64 and the diffusion layer 26 is reduced. That is, the contact resistance values between the rear contact electrodes 63 and 64 and the diffusion layers 25 and 26 are identical to the contact resistance values between front contact electrodes (not shown) connected to the low-resistance parts 27 and 28 formed at the front surfaces of the diffusion layers 25 and 26 from the front surface and the diffusion layers 25 and 26.

Therefore, the contact electrode that was formed on the gate electrode 22 in the related art will not be formed, so parasitic capacitance between the gate electrode 22 and the rear contact electrodes 63 and 64 is reduced.

Even though the distance between the gate electrode 22 and the contact electrodes is reduced in terms of planar layout with element miniaturization, the gate electrode 22 can be reliably insulated from the rear contact electrodes 63 and 64.

The miniaturization of the contact electrodes is facilitated with a small aspect ratio of the rear contact electrodes 63 and 64.

Even when a so-called stress liner film (not shown) is provided on the transistor so as to improve mobility, the stress liner film is not disconnected by the contact electrodes, so loss of a stress effect of the stress liner film is small. The stress liner film (CSIL: Channel Stress Induced Liner) is typically formed of a silicon nitride film having tensile stress or compressive stress.

[Third Example of Configuration of Semiconductor Device]

Next, a third example of the configuration of the semiconductor device according to the first embodiment of the invention will be described with reference to a schematic sectional view of FIG. 3.

Figure 3:
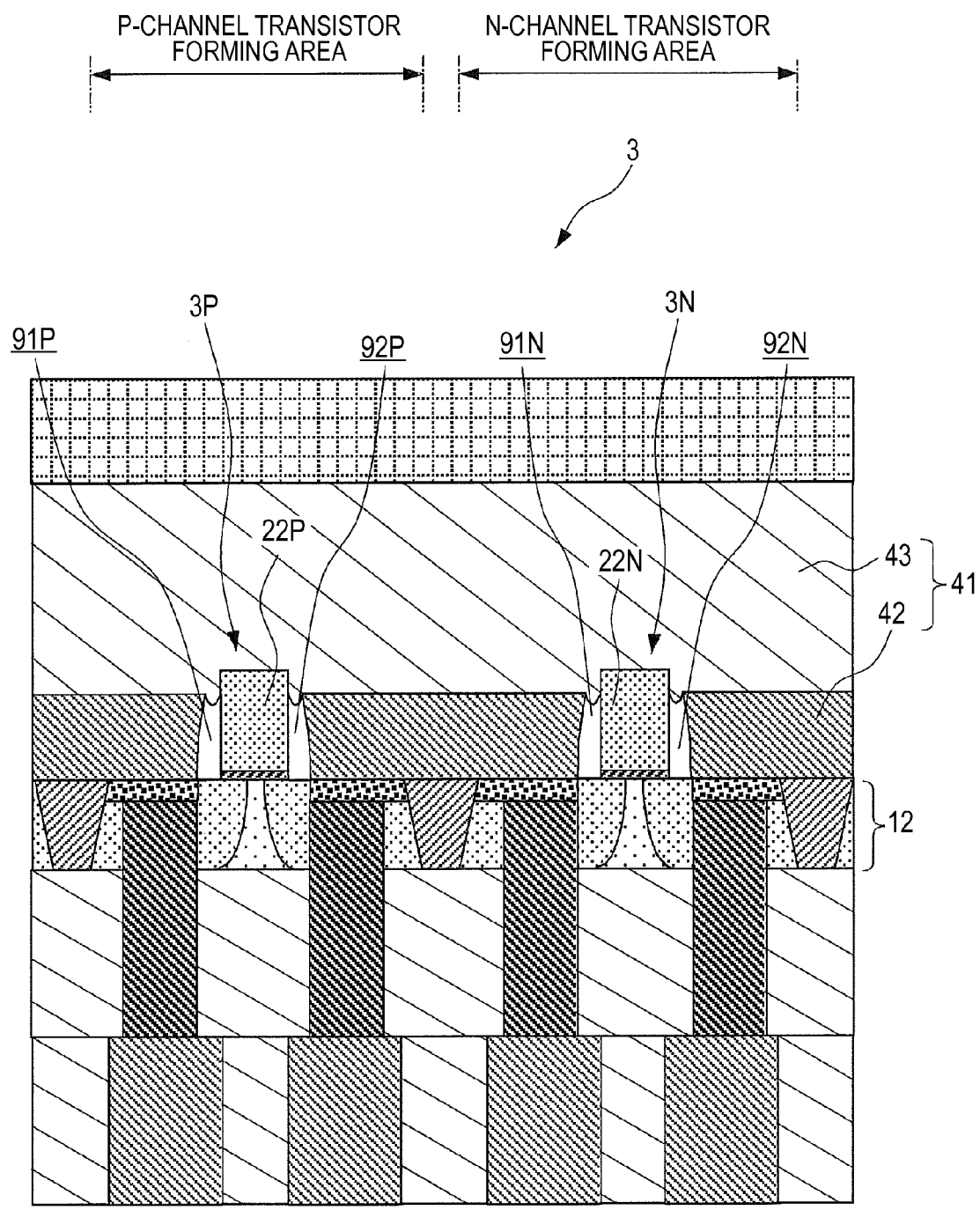
FIG. 3 is a schematic sectional view showing a third example of the configuration of the semiconductor device according to the first embodiment of the invention.

As shown in FIG. 3, a semiconductor device 3 has a P-channel transistor 3P and an N-channel transistor 3N formed in a semiconductor area 12. The semiconductor device 3 is different from the above-described semiconductor device 1 in that spaces 91P and 92P are provided instead of the sidewalls 23P and 24P (see FIG. 1) formed at the sidewalls of the gate electrode 22P. Further, spaces 91N and 92N are provided instead of the sidewalls 23N and 24N (see FIG. 1) formed at the sidewalls of the gate electrode 22N.

A first insulating interlayer 42 is formed laterally to the gate electrode 22P through the spaces 91P and 92P. The first insulating interlayer 42 is formed laterally to the gate electrode 22N through the spaces 91N and 92N.

A second insulating interlayer 43 is formed on the first insulating interlayer 42 so as not to fill the spaces 91P and 92P and the spaces 91N and 92N. Thus, the first insulating interlayer 42 and the second insulating interlayer 43 form the insulating interlayer 41.

Other parts are the same as described with reference to FIG. 1.

In the semiconductor device 3, the spaces 91P and 92P can be formed laterally to the gate electrode 22P, and the spaces 91N and 92N can be formed laterally to the gate electrode 22N, so parasitic capacitance can be further reduced. Further, the same advantages as the semiconductor device 1 are obtained. Similarly to the semiconductor device 1, the semiconductor device 3 may have completely depleted transistors.

[Fourth Example of Configuration of Semiconductor Device]

Next, a fourth example of the configuration of the semiconductor device according to the first embodiment of the invention will be described with reference to a schematic sectional view of FIG. 1.

As shown in FIG. 1, the fourth example of the configuration of the semiconductor device is configured such that the sidewalls 23P and 24P and the sidewalls 23N and 24N are formed of, for example, low-dielectric-constant films having a dielectric constant lower than silicon oxide. Examples of the low-dielectric-constant films include an organic insulating film.

In this way, the sidewalls 23P and 24P and the sidewalls 23N and 24N are formed of low-dielectric-constant films, so parasitic capacitance can be further reduced.

[Fifth Example of Configuration of Semiconductor Device]

Next, a fifth example of the configuration of the semiconductor device according to the first embodiment of the invention will be described with reference to a schematic sectional view of FIG. 4.

Figure 4:
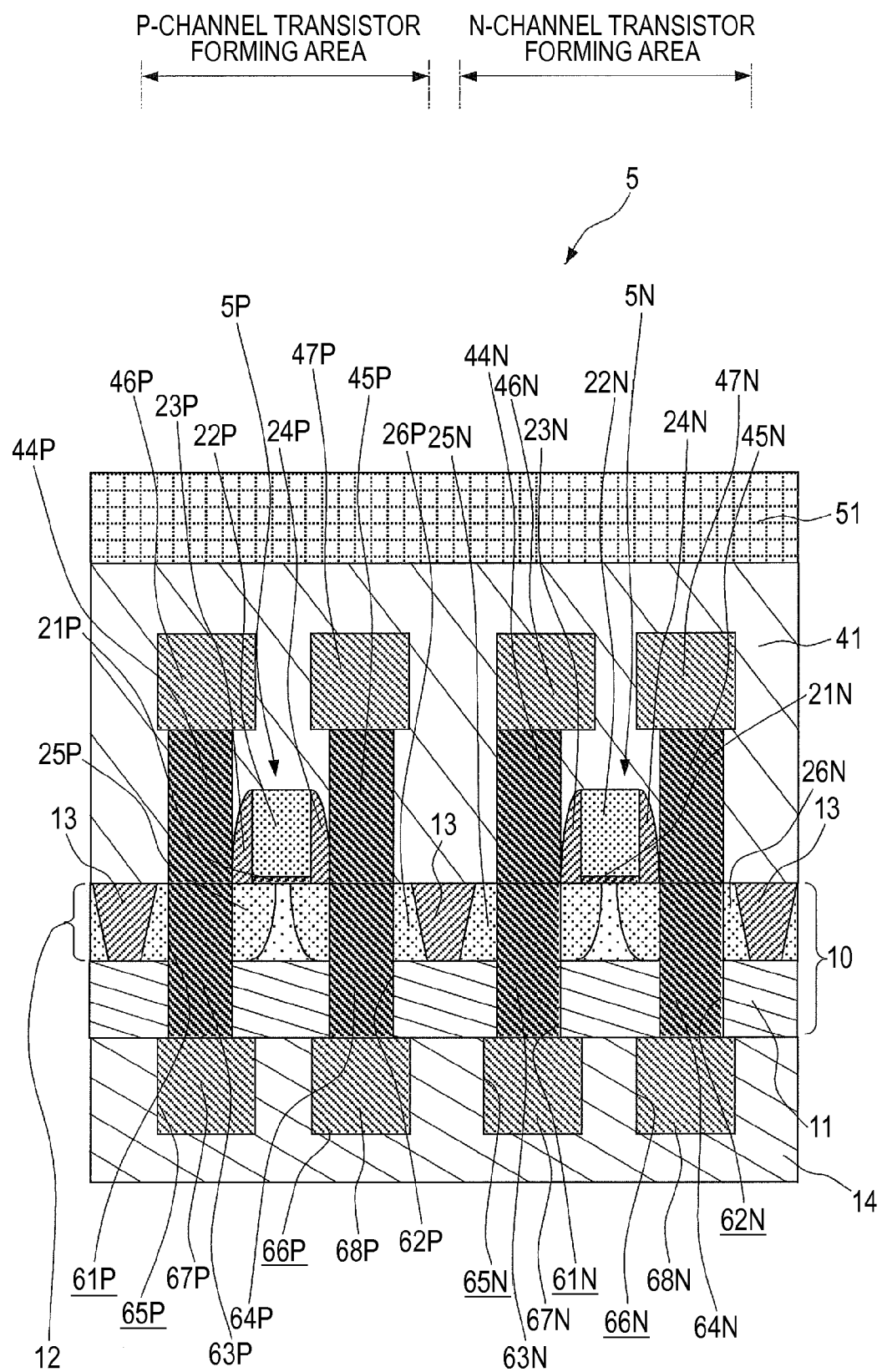
FIG. 4 is a schematic sectional view showing a fifth example of the configuration of the semiconductor device according to the first embodiment of the invention.

As shown in FIG. 4, a substrate 10 has a semiconductor area 12 formed on the first insulating film 11. The first insulating film 11 is formed of, for example, a silicon nitride (SiN) film, silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a P-channel transistor forming area and an N-channel transistor forming area from each other.

A P-channel transistor 5P is formed in the semiconductor area 12 of the PMOS transistor forming area, and an N-channel transistor 5N is formed in the semiconductor area 12 of the NMOS transistor forming area.

Hereinafter, the details will be described.

A gate electrode 22P is formed on the P-channel transistor forming area of the semiconductor area 12 through a gate insulating film 21P.

The gate insulating film 21P is formed of, for example, a so-called high-dielectric-constant (High-k) film of hafnium oxide ($HfO_2$), hafnium nitride silicate (HfSiON), zirconium oxide ($ZrO_2$), zirconium nitride silicate (ZrSiON), or the like. Alternatively, the gate insulating film 21P is formed of a composite film of a thermal oxynitride film and the high-dielectric-constant film.

The gate electrode 22P is made of, for example, polysilicon. Alternatively, the gate electrode 22P is made of, titanium nitride (TiN), tantalum carbide (TaC), tungsten (W), or the like.

Sidewalls 23P and 24P are formed at the sidewalls of the gate electrode 22P. The sidewalls 23P and 24P are made of, for example, silicon oxide (SiO$_2$), silicon nitride (SiN), silicon oxynitride (SiON), or the like. Alternatively, the sidewalls 23P and 24P are formed of composite films of these materials.

Diffusion layers 25P and 26P are formed in the semiconductor area 12 on both sides of the gate electrode 22P. The diffusion layers 25P and 26P are of p type and form source and drain areas. The semiconductor area 12 between the diffusion layers 25P and 26P forms a channel area.

In this way, the P-channel transistor 5P is formed in the semiconductor area 12.

A gate electrode 22N is formed on the N-channel transistor forming area of the semiconductor area 12 through a gate insulating film 21N.

The gate insulating film 21N is formed of, for example, a so-called high-dielectric-constant (High-k) film of hafnium oxide (HfO$_2$), hafnium nitride silicate (HfSiON), zirconium oxide (ZrO$_2$), zirconium nitride silicate (ZrSiON), or the like. Alternatively, the gate insulating film 21N is formed of a composite film of a thermal oxynitride film and the high-dielectric-constant film.

The gate electrode 22N is made of, for example, polysilicon. Alternatively, the gate electrode 22N is made of, titanium nitride (TiN), tantalum carbide (TaC), tungsten (W), or the like.

Sidewalls 23N and 24N are formed at the sidewalls of the gate electrode 22N. The sidewalls 23N and 24N are made of, for example, silicon oxide (SiO$_2$), silicon nitride, silicon oxynitride, or the like. Alternatively, the sidewalls 23N and 24N are formed of composite films of these materials.

Diffusion layers 25N and 26N are formed in the semiconductor area 12 on both sides of the gate electrode 22N. The diffusion layers 25N and 26N are of N type and form source and drain areas. The semiconductor area 12 between the diffusion layers 25N and 26N forms a channel area.

In this way, the N-channel transistor 5N is formed in the semiconductor area 12.

As described above, the semiconductor device 5 has the P-channel transistor 5P and the N-channel transistor 5N. Similarly to the semiconductor device 1, the semiconductor device 5 may have completely depleted transistors. The semiconductor device 5 may have one of the transistors.

An insulating interlayer 41 is formed on the semiconductor area 12 so as to cover the semiconductor device 5. The insulating interlayer 41 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the insulating interlayer 41 is formed of an insulating film, such as an organic insulating film or the like, made of a material for an insulating interlayer of a typical semiconductor device. The surface of the insulating interlayer 41 is planarized.

Electrodes (contact electrodes) 44P and 45P are formed in the insulating interlayer 41 so as to be respectively connected to the front surfaces of the diffusion layers 25P and 26P. The electrodes 44P and 45P become low-resistance parts. Further, electrodes (contact electrode) 44N and 45N are formed so as to be respectively connected to the diffusion layers 25N and 26N. The electrodes 44N and 45N become low-resistance parts.

Interconnects 46P and 47P are formed so as to be respectively connected to the electrodes 44P and 45P. Interconnects 46N and 47N are formed so as to be respectively connected to the electrodes 44N and 45N.

A support substrate 51 is formed on the insulating interlayer 41. Examples of the support substrate 51 include a silicon substrate, a glass substrate, a plastic substrate, and the like.

Contact holes 61P and 62P are formed in the first insulating film 11 so as to communicate with the diffusion layers 25P and 26P, respectively. The contact holes 61P and 62P respectively pass through the diffusion layers 25P and 26P and reach the rear surfaces of the electrodes 45P and 46P. Rear contact electrodes 63P and 64P are respectively formed in the contact holes 61P and 62P and connected to the rear surfaces of the electrodes 45P and 46P. The rear contact electrodes 63P and 64P are respectively formed by filling the contact holes 61P and 62P with metal materials, for example, titanium (Ti), titanium nitride (TiN), tantalum (Ta), tantalum nitride (TaN), tungsten (W), copper (Cu), or the like.

Similarly, contact holes 61N and 62N are formed in the first insulating film 11 so as to communicate with the diffusion layers 25N and 26N, respectively. The contact holes 61N and 62N respectively pass through the diffusion layers 25N and 26N and reach the rear surfaces of the electrodes 45N and 46N. Rear contact electrodes 63N and 64N are respectively formed in the contact holes 61N and 62N and connected to the rear surfaces of the electrodes 45N and 46N. The rear contact electrodes 63N and 64N are respectively formed by filling the contact holes 61N and 62N with metal materials, for example, titanium (Ti), titanium nitride (TiN), tantalum (Ta), tantalum nitride (TaN), tungsten (W), copper (Cu), or the like.

A second insulating film 14 is formed at the first insulating film 11. The second insulating film 14 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the second insulating film 14 is formed of an insulating film, such as an organic insulating film or the like, made of a material for an insulating interlayer of a typical semiconductor device.

Interconnect grooves 65P and 66P are formed in the second insulating film 14 so as to communicate with the rear contact electrodes 63P and 64P, respectively. The interconnect grooves 65P and 66P respectively reach the rear contact electrodes 63P and 64P. Interconnects 67P and 68P are respectively formed in the interconnect grooves 65P and 66P and connected to the rear contact electrodes 63P and 64P. The interconnects 67P and 68P are respectively formed by filling the interconnect grooves 65P and 66P with metal materials, for example, titanium (Ti), titanium nitride (TiN), tantalum (Ta), tantalum nitride (TaN), ruthenium (Ru), copper (Cu) or the like, or composite films thereof.

Similarly, interconnect grooves 65N and 66N are formed in the second insulating film 14 so as to communicate with the rear contact electrodes 63N and 64N, respectively. The interconnect grooves 65N and 66N respectively reach the rear contact electrodes 63N and 64N. Interconnects 67N and 68N are respectively formed in the interconnect grooves 65N and 66N and connected to the rear contact electrodes 63N and 64N. The interconnects 67N and 68N are respectively formed by filling the interconnect grooves 65N and 66N with metal materials, for example, titanium (Ti), titanium nitride (TiN), tantalum (Ta), tantalum nitride (TaN), ruthenium (Ru), copper (Cu) or the like, or composite films thereof.

Though not shown, an N-th (where N≥2) interconnect and an (N−1)th rear contact electrode connecting the N-th layered interconnect and an (N–1)th interconnect may be formed. That is, the interconnect may be formed in the form of a multilayer interconnect.

In the semiconductor device 5, the rear contact electrodes 63P, 64P, 63N, and 64N are respectively connected directly to the electrodes 45P, 46P, 45N, and 46N through the diffusion layers 25P, 26P, 25N, and 26N. Therefore, for example, the contact resistance value between the rear contact electrode 63P and the diffusion layer 25P is reduced. Similarly, the contact resistance values between the rear contact electrodes 64P, 63N, and 64N and the diffusion layers 26P, 25N, and 26N are reduced. That is, the contact resistance values between the rear contact electrodes 63P, 64P, 63N, and 64N and the diffusion layers 25P, 26P, 25N, and 26N are identical to the contact resistance values between front contact electrodes (not shown) connected to the electrodes 45P, 46P, 45N, and 46N formed at the front surfaces of the diffusion layers 25P, 26P, 25N, and 26N from the front surface and the diffusion layers 25P, 26P, 25N, and 26N.

Therefore, the contact electrodes that were formed on the gate electrodes 22P and 22N in the related art will not be formed, so parasitic capacitance between the gate electrodes 22P and 22N and the rear contact electrodes 63P, 64P, 63N, and 64N is reduced.

Even though the distance between the gate electrodes 22P and 22N and the contact electrode is reduced in terms of planar layout with element miniaturization, the gate electrodes 22P and 22N can be reliably insulated from the rear contact electrodes 63P, 64P, 63N, and 64N.

The miniaturization of the contact electrodes are facilitated with a small aspect ratio of the rear contact electrodes 63P, 64P, 63N, and 64N.

Even when a so-called stress liner film (not shown) is provided on the transistor so as to improve mobility, the stress liner film is not disconnected by the contact electrodes, so loss of a stress effect of the stress liner film is small. The stress liner film (CSIL: Channel Stress Induced Liner) is typically formed of a silicon nitride film having tensile stress or compressive stress.

2. Second Embodiment

[Sixth Example of Configuration of Semiconductor Device]

Figure 5:
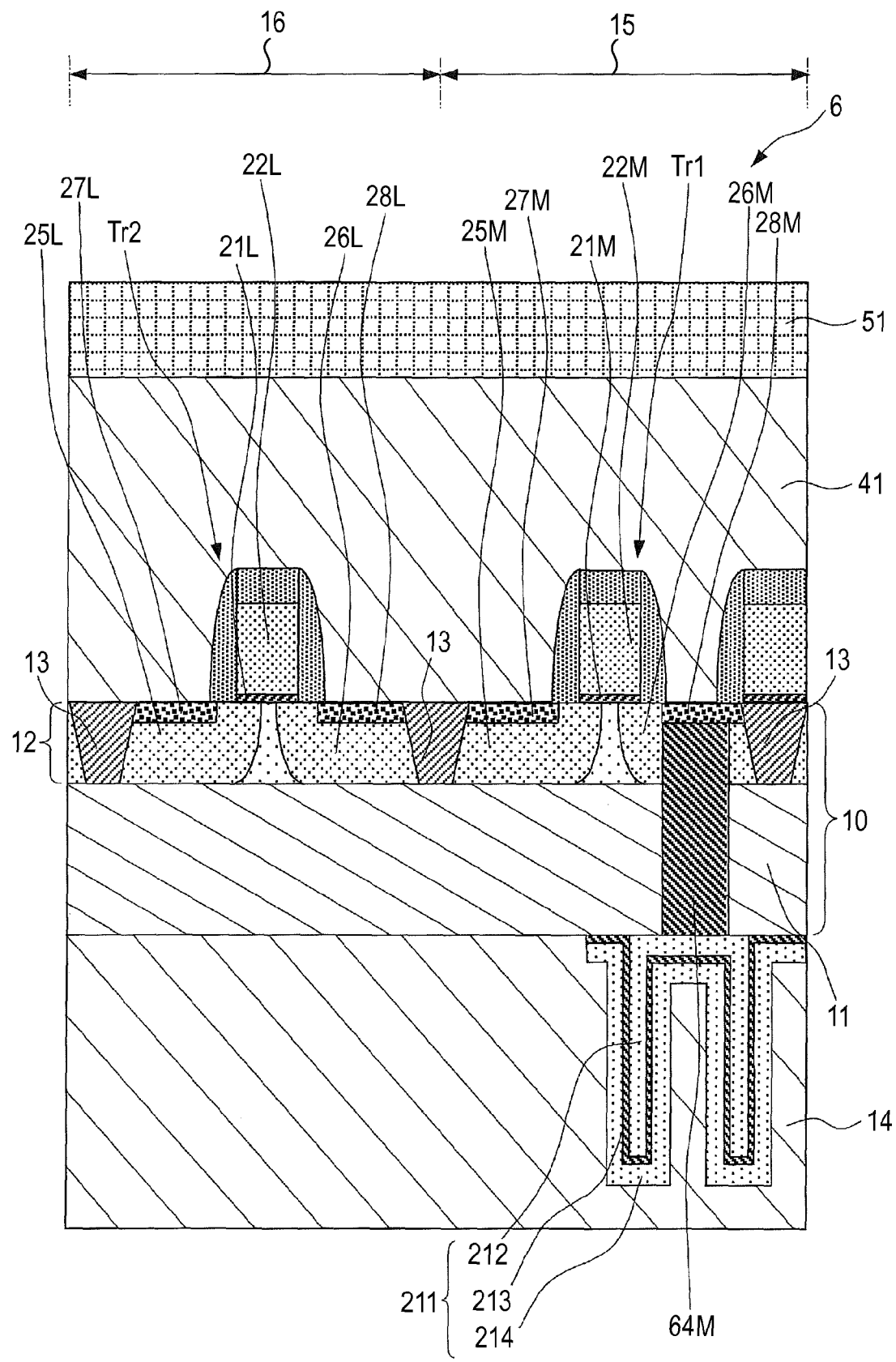
FIG. 5 is a schematic sectional view showing a sixth example of the configuration of a semiconductor device according to a second embodiment of the invention.

A sixth example of the configuration of a semiconductor device according to the second embodiment of the invention will be described with reference to a schematic sectional view of FIG. 5. FIG. 5 shows an example where a capacitor serving as a memory element is formed on the rear surface of a substrate 10.

As shown in FIG. 5, the substrate 10 has a semiconductor area 12 formed on the first insulating film 11. The first insulating film 11 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a memory element part 15 and a logic element part 16. The element isolation area 13 has, for example, an STI (Shallow Trench Isolation) structure and is formed by filling an element isolation groove formed in the semiconductor area 12 with silicon oxide.

A first field effect transistor Tr1 is formed in the semiconductor area 12 of the memory element part 15, and a second field effect transistor Tr2 is formed in the semiconductor area 12 of the logic element part 16.

The first field effect transistor Tr1 has a gate electrode 22M formed on the front surface of the semiconductor area 12 through a gate insulating film 21M. Diffusion layers 25M and 26M that become source and drain areas are formed in the semiconductor area 12 on both sides of the gate electrode 22M. Low-resistance parts 27M and 28M are respectively formed at the front surfaces of the diffusion layers 25M and 26M. A portion of the semiconductor area 12 between the diffusion layers 25M and 26M becomes a channel area of the first field effect transistor Tr1.

The gate insulating film 21M, the gate electrode 22M, and the low-resistance parts 27M and 28M are made of the same materials as the gate insulating film, the gate electrode, and the low-resistance parts of the semiconductor device 1.

The second field effect transistor Tr2 has a gate electrode 22L formed on the front surface of the semiconductor area 12 through a gate insulating film 21L. Diffusion layers 25L and 26L that become source and drain areas are formed in the semiconductor area 12 on both sides of the gate electrode 22L. A portion of the semiconductor area 12 between the diffusion layers 25L and 26L becomes a channel area of the second field effect transistor Tr2.

The gate insulating film 21L, the gate electrode 22L, and the low-resistance parts 27L and 28L are made of the same materials as the gate insulating film, the gate electrode, and the low-resistance parts of the semiconductor device 1.

A insulating interlayer 41 is formed on the front surface of the semiconductor area 12 so as to cover the first field effect transistor Tr1 and the second field effect transistor Tr2. The insulating interlayer 41 is formed so as to have a thickness of, for example, several hundred nm or more, and the surface thereof is planarized.

A support substrate 51 is formed on the insulating interlayer 41.

A rear contact electrode 64M is formed in the first insulating film 11 so as to be connected to the diffusion layer 26M. As a memory element connected to the rear contact electrode 64M, for example, a capacitor 211 is formed.

The capacitor 211 has a first electrode 212 and a second electrode 214 formed on the front surface of the first electrode 212 with a capacitor insulating film 213 interposed therebetween.

The diffusion layer 26M and the first electrode 212 pass through the first insulating film 11 and the diffusion layer 26M and are electrically connected to the rear contact electrode 64M connected to the rear surface of the low-resistance part 28M.

A second insulating film 14 is formed on the first insulating film 11 so as to cover the capacitor 211.

In the semiconductor device 6, when the capacitor 211 is mounted on a logic device, the capacitor 211 that was formed on the front surface in the related art can be arranged on the rear surface. Therefore, the rules for miniaturization can be applied, so a high-capacity memory can be easily formed.

The capacitor 211 and the first field effect transistor Tr1 serving as an access transistor can be connected to each other at the shallow rear contact electrode 64M. Therefore, reduction in contact resistance, improvement in MOSFET performance, and improvement in yield of contact electrodes are achieved.

[Seventh Example of Configuration of Semiconductor Device]

Figure 6:
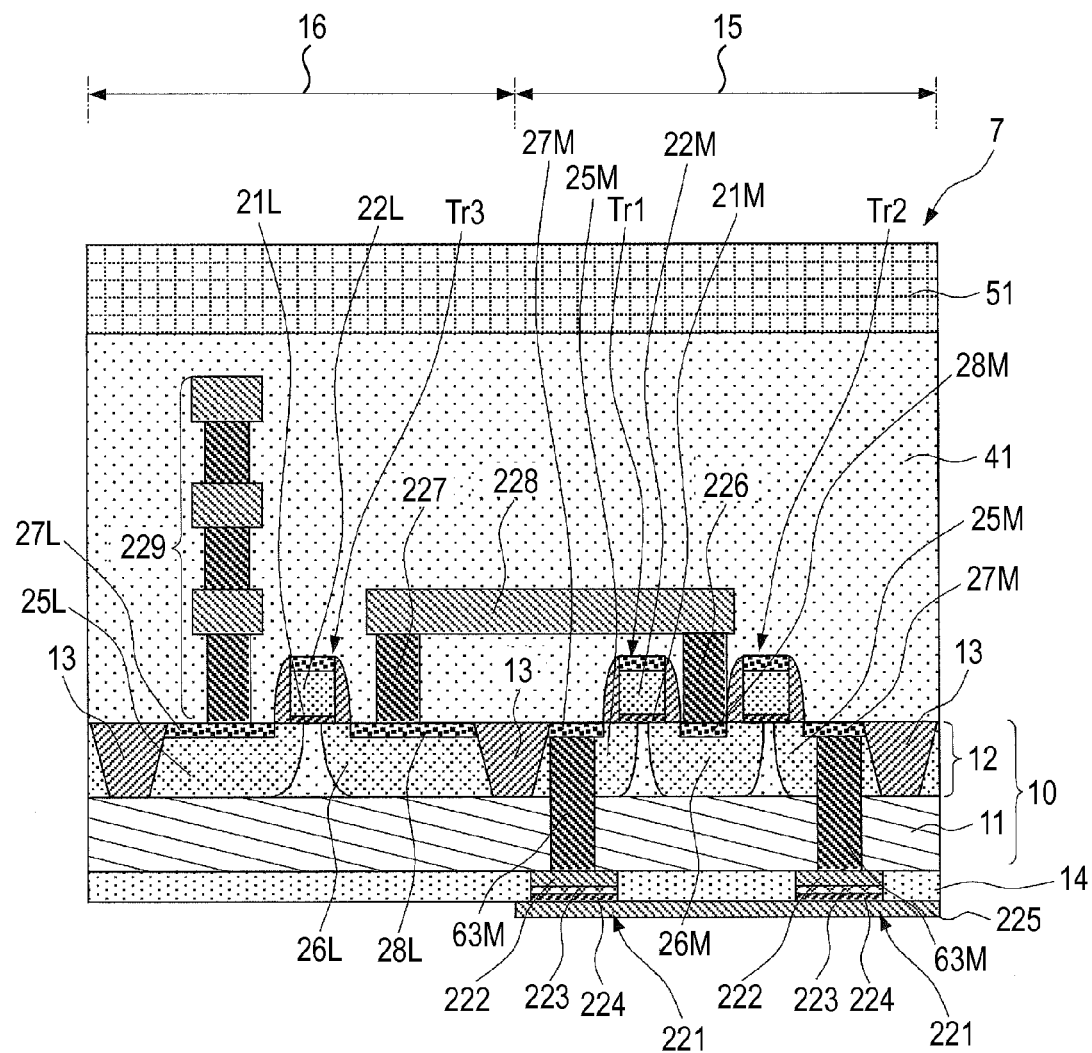
FIG. 6 is a schematic sectional view showing a seventh example of the configuration of the semiconductor device according to the second embodiment of the invention.

Next, a seventh example of the configuration of the semiconductor device according to the second embodiment of the invention will be described with reference to a schematic sectional view of FIG. 6. FIG. 6 shows an example where a resistance-change memory element serving as a memory element is formed on the rear surface of a substrate 10.

As shown in FIG. 6, the substrate 10 has a semiconductor area 12 formed on the first insulating film 11. The first insulating film 11 is formed of, for example, a silicon nitride (SiN) film, silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a memory element part 15 and a logic element part 16. The element isolation area 13 has, for example, an STI (Shallow Trench Isolation) structure and is formed by filling an element isolation groove formed in the semiconductor area 12 with silicon oxide.

A first field effect transistor Tr1 and a second field effect transistor Tr2 that share a single diffusion layer are formed to be adjacent to each other in the semiconductor area 12 of the memory element part 15. A third field effect transistor Tr3 is formed in the semiconductor area 12 of the logic element part 16.

The first and second field effect transistors Tr1 and Tr2 each have a gate electrode 22M formed on the front surface of the semiconductor area 12 through a gate insulating film 21M. Diffusion layers 25M and 26M that become source and drain areas are formed in the semiconductor area 12 on both sides of the gate electrode 22M. The diffusion layer 26M is shared. Low-resistance parts 27M and 28M are respectively formed at the front surfaces of the diffusion layers 25M and 26M. The semiconductor area 12 between the diffusion layers 25M and 26M on one side (the left side in the drawing) becomes a channel area of the first field effect transistor Tr1. The semiconductor area 12 between the diffusion layers 25M and 26M on the other side (the right side in the drawing) becomes a channel area of the second field effect transistor Tr2.

The gate insulating film 21M, the gate electrode 22M, and the low-resistance parts 27M and 28M are made of the same materials as the gate insulating film, the gate electrode, and the low-resistance parts of the semiconductor device 1.

The third field effect transistor Tr3 has a gate electrode 22L formed on the front surface of the semiconductor area 12 through a gate insulating film 21L. Diffusion layers 25L and 26L that become source and drain areas are formed in the semiconductor area 12 on both sides of the gate electrode 22L. Low-resistance parts 27L and 28L are respectively formed at the front surfaces of the diffusion layers 25L and 26L. A portion of the semiconductor area 12 between the diffusion layers 25L and 26L becomes a channel area of the third field effect transistor Tr3.

The gate insulating film 21L, the gate electrode 22L, and the low-resistance parts 27L and 28L are made of the same materials as the gate insulating film, the gate electrode, and the low-resistance parts of the semiconductor device 1.

An insulating interlayer 41 is formed on the front surface of the semiconductor area 12 so as to cover the first field effect transistor Tr1, the second field effect transistor Tr2, the third field effect transistor Tr3, and the like. The insulating interlayer 41 is formed so as to have a thickness of, for example, several hundred nm or more, and the surface thereof is planarized.

A support substrate 51 is formed on the insulating interlayer 41.

A rear contact electrode 63M is formed in the first insulating film 11 so as to be connected to the diffusion layer 25M.

A resistance-change memory element 221 is formed so as to be connected to the rear contact electrode 63M.

The resistance-change memory element 221 is formed by laminating a first electrode 222, a memory layer 223, an ion source layer 224, and a second electrode 225.

The first electrode 222 and the second electrode 225 are made of, for example, platinum (Pt), tungsten (W), tungsten nitride (WN), copper (Cu), or the like.

The memory layer (resistance-change film) 223 is made of metal oxide. Examples of the metal oxide include tantalum oxide, niobium oxide, aluminum oxide, nickel oxide, cobalt oxide, titanium oxide, hafnium oxide, zirconium oxide, gallium oxide, or the like, or a mixture thereof. The memory layer 223 is preferably thin, and is formed to have a thickness equal to or less than 2 nm, preferably equal to or less than 1 nm, and more preferably equal to or less than 0.5 nm.

The ion source layer 224 contains, for example, at least one of copper (Cu), silver (Ag), and zinc (Zn) and at least one of chalcogenide elements, such as tellurium (Te), selenium (Se), and sulfur (S). For example, CuTe, GeSbTe, CuGeTe, AgGeTe, AgTe, ZnTe, ZnGeTe, CuS, CuGeS, CuSe, CuGe Se, and the like may be exemplified. The light source layer 224 may contain boron (B), a rare earth element, or silicon (Si).

Thus, the ion source layer 224 contains at least one of Cu, Ag, and Zn. That is, the ion source layer 224 is a layer for supplying ions of at least one of Cu, Ag, and Zn to the memory layer 223, or for receiving ions supplied to the memory layer 223.

The diffusion layer 25M and the first electrode 222 pass through the first insulating film 11 and the diffusion layer 25M and are electrically connected to each other by the rear contact electrode 63M connected to the rear surface of the low-resistance part 27M.

In the drawing, the second electrode 225 is used as an interconnect. For this reason, the second insulating film 14 is formed so as to bury the first electrode 222, the memory layer 223, and the ion source layer 224, and the second electrode 225 is connected to the ion source layer 224 and arranged on the second insulating film 14.

A contact electrode 226 is connected to the diffusion layer 26M of the first field effect transistor Tr1, and a contact electrode 227 is connected to the diffusion layer 26L of the third field effect transistor Tr3. The contact electrodes 226 and 227 are connected to each other by an interconnect 228. Thus, the diffusion layer 26M of the first field effect transistor Tr1 is electrically connected to the diffusion layer 26L of the third field effect transistor Tr3. A multilayer interconnect part 229 formed by laminating contact electrodes and interconnects in multiple layers (three layers in the drawing) is connected to the diffusion layer 25L of the third field effect transistor Tr3.

In the semiconductor device 7, when the resistance-change memory element 221 is mounted on a logic device, the resistance-change memory element 221 that was formed on an uppermost interconnect in the related art can be arranged on the rear surface. Therefore, the rules for miniaturization can be applied, so a high-capacity memory can be easily formed.

The resistance-change memory element 221 and the first and second field effect transistors Tr1 and Tr2 serving as access transistors can be connected to each other at the shallow rear contact electrode 63M. Therefore, reduction in contact resistance, improvement in MOSFET performance, and improvement in yield of contact electrodes are achieved.

[Eighth Example of Configuration of Semiconductor Device]

Figure 7:
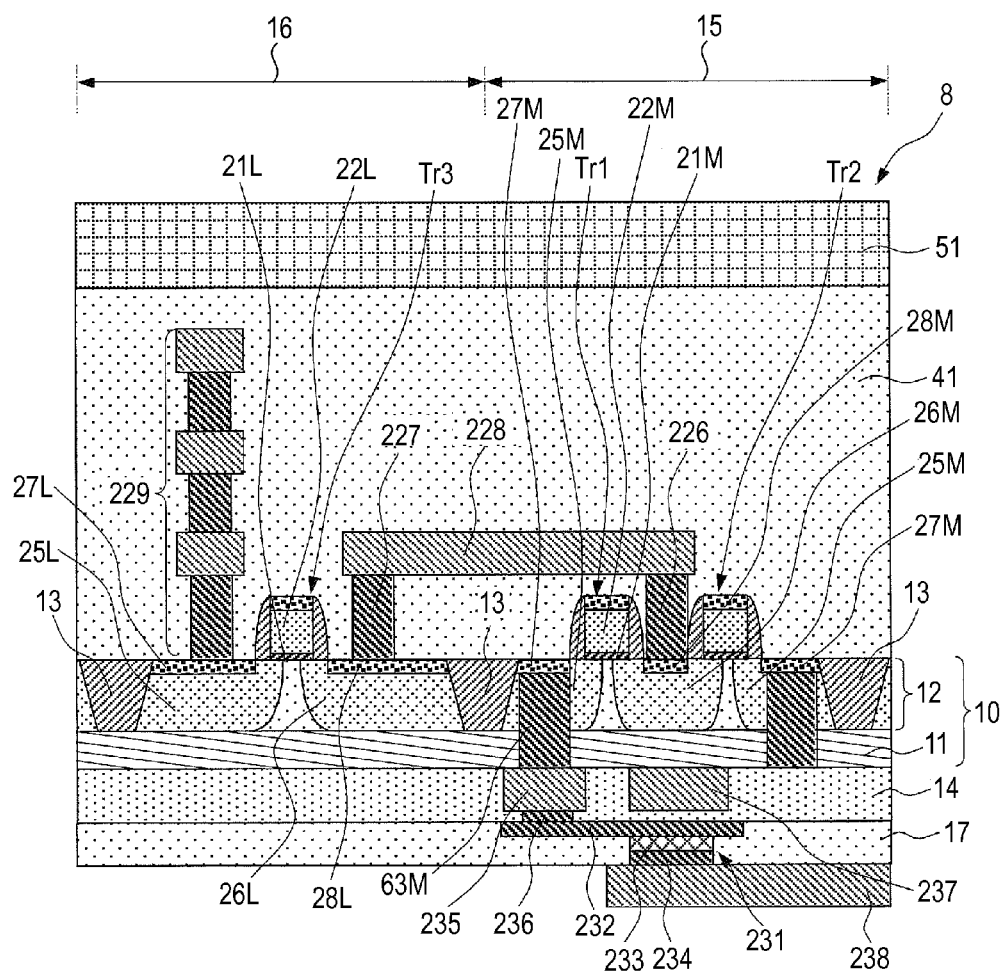
FIG. 7 is a schematic sectional view showing an eighth example of the configuration of the semiconductor device according to the second embodiment of the invention.

Next, an eighth example of the configuration of the semiconductor device according to the second embodiment of the invention will be described with reference to a schematic sectional view of FIG. 7. FIG. 7 shows an example where a magnetoresistive memory element serving as a memory element is formed on the rear surface of a substrate 10.

As shown in FIG. 7, the substrate 10 has a semiconductor area 12 formed on the first insulating film 11. The first insulating film 11 is formed of, for example, a silicon nitride (SiN) film, silicon oxide (SiO$_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a memory element part 15 and a logic element part 16. The element isolation area 13 has, for example, an STI (Shallow Trench Isolation) structure and is formed by filling an element isolation groove formed in the semiconductor area 12 with silicon oxide.

A first field effect transistor Tr1 and a second field effect transistor Tr2 that share a single diffusion layer are formed to be adjacent to each other in the semiconductor area 12 of the memory element part 15. A third field effect transistor Tr3 is formed in the semiconductor area 12 of the logic element part 16.

The first and second field effect transistors Tr1 and Tr2 each have a gate electrode 22M formed on the front surface of the semiconductor area 12 through a gate insulating film 21M. Diffusion layers 25M and 26M that become source and drain areas are formed in the semiconductor area 12 on both sides of the gate electrode 22M. The diffusion layer 26M is shared. Low-resistance parts 27M and 28M are respectively formed at the front surfaces of the diffusion layers 25M and 26M. The semiconductor area 12 between the diffusion layers 25M and 26M on one side (the left side in the drawing) becomes a channel area of the first field effect transistor Tr1. The semiconductor area 12 between the diffusion layers 25M and 26M on the other side (the right side in the drawing) becomes a channel area of the second field effect transistor Tr2.

The gate insulating film 21M, the gate electrode 22M, and the low-resistance parts 27M and 28M are made of the same materials as the gate insulating film, the gate electrode, and the low-resistance parts of the semiconductor device 1.

The third field effect transistor Tr3 has a gate electrode 22L formed on the front surface of the semiconductor area 12 through a gate insulating film 21L. Diffusion layers 25L and 26L that become source and drain areas are formed in the semiconductor area 12 on both sides of the gate electrode 22L. Low-resistance parts 27L and 28L are respectively formed at the front surfaces of the diffusion layers 25L and 26L. A portion of the semiconductor area 12 between the diffusion layers 25L and 26L becomes a channel area of the third field effect transistor Tr3.

The gate insulating film 21L, the gate electrode 22L, and the low-resistance parts 27L and 28L are made of the same materials as the gate insulating film, the gate electrode, and the low-resistance parts of the semiconductor device 1.

An insulating interlayer 41 is formed on the front surface of the semiconductor area 12 so as to cover the first field effect transistor Tr1, the second field effect transistor Tr2, the third field effect transistor Tr3, and the like. The insulating interlayer 41 is formed so as to have a thickness of, for example, several hundred nm or more, and the surface thereof is planarized.

A support substrate 51 is formed on the insulating interlayer 41.

A rear contact electrode 63M is formed so as to pass through the first insulating film 11 and the diffusion layer 25M and to be connected to the rear surface of the low-resistance part 27M. An interconnect 235 connected to the rear contact electrode 63M and a contact electrode 236 connected to the interconnect 235 are formed.

A write line 237 is formed at the same layer as the interconnect 235. The write line 237 generates a magnetic field when a current flows therein and inverts the magnetization direction of a free layer of an MTJ film 233 described below. The write line 237 is made of, for example, copper (Cu), aluminum (Al), titanium (Ti), tantalum (Ta), titanium, nitride (TiN), tungsten (W), tantalum, nitride (TaN), or the like.

The magnetoresistive memory element 231 is formed on the write line 237 through a second insulating film 14.

The magnetoresistive memory element 231 is formed by laminating a first electrode 232, an MTJ film 233, and a second electrode 234. The first electrode 232 is connected to the contact electrode 236.

The first electrode 232 is made of, for example, titanium nitride (TiN), tungsten (W), platinum (Pt), or the like. The second electrode 234 is made of, for example, platinum (Pt).

The term "MTJ" is an abbreviation of Magnetic Tunnel Junction, and means a magnetic tunnel junction. The MTJ film 233 is formed to have a laminated structure of a pinning layer, a tunnel insulating film, and a free layer. The pinning layer is made of, for example, cobalt (Co), cobalt-iron-boron (CFeB), or the like. The tunnel insulating film is formed of, for example, an oxide film of aluminum oxide, magnesium oxide, or the like. The free layer is formed of, for example, a laminated film of nickel-iron (NiFe), ruthenium (Ru), and nickel-iron (NiFe), cobalt-ion (CoFe), or the like.

A third insulating film 17 is formed so as to bury the magnetoresistive memory element 231. A bit line (or power line) 238 is provided in the third insulating film 17 so as to be connected to the second electrode 234 of the magnetoresistive memory element 231 and to extend in a direction orthogonal to the write line 237.

A contact electrode 226 is connected to the diffusion layer 26M of the first field effect transistor Tr1, and a contact electrode 227 is connected to the diffusion layer 26L of the third field effect transistor Tr3. The contact electrodes 226 and 227 are connected to each other by an interconnect 228. Thus, the diffusion layer 26M of the first field effect transistor Tr1 is electrically connected to the diffusion layer 26L of the third field effect transistor Tr3. A multilayer interconnect part 229 formed by laminating contact electrodes and interconnects in multiple layers (three layers in the drawing) is connected to the diffusion layer 25L of the third field effect transistor Tr3.

In the semiconductor device 8, when the magnetoresistive memory element 231 is mounted on a logic device, the magnetoresistive memory element 231 that was formed on an uppermost interconnect in the related art can be arranged on the rear surface. Therefore, the rules for miniaturization can be applied, so a high-capacity memory can be easily formed.

The magnetoresistive memory element 231 and the first field effect transistor Tr1 serving as an access transistor can be connected to each other at the shallow rear contact electrode 63M. Therefore, reduction in contact resistance, improvement in MOSFET performance, and improvement in yield of contact electrodes are achieved.

[Ninth Example of Configuration of Semiconductor Device]

Figure 8:
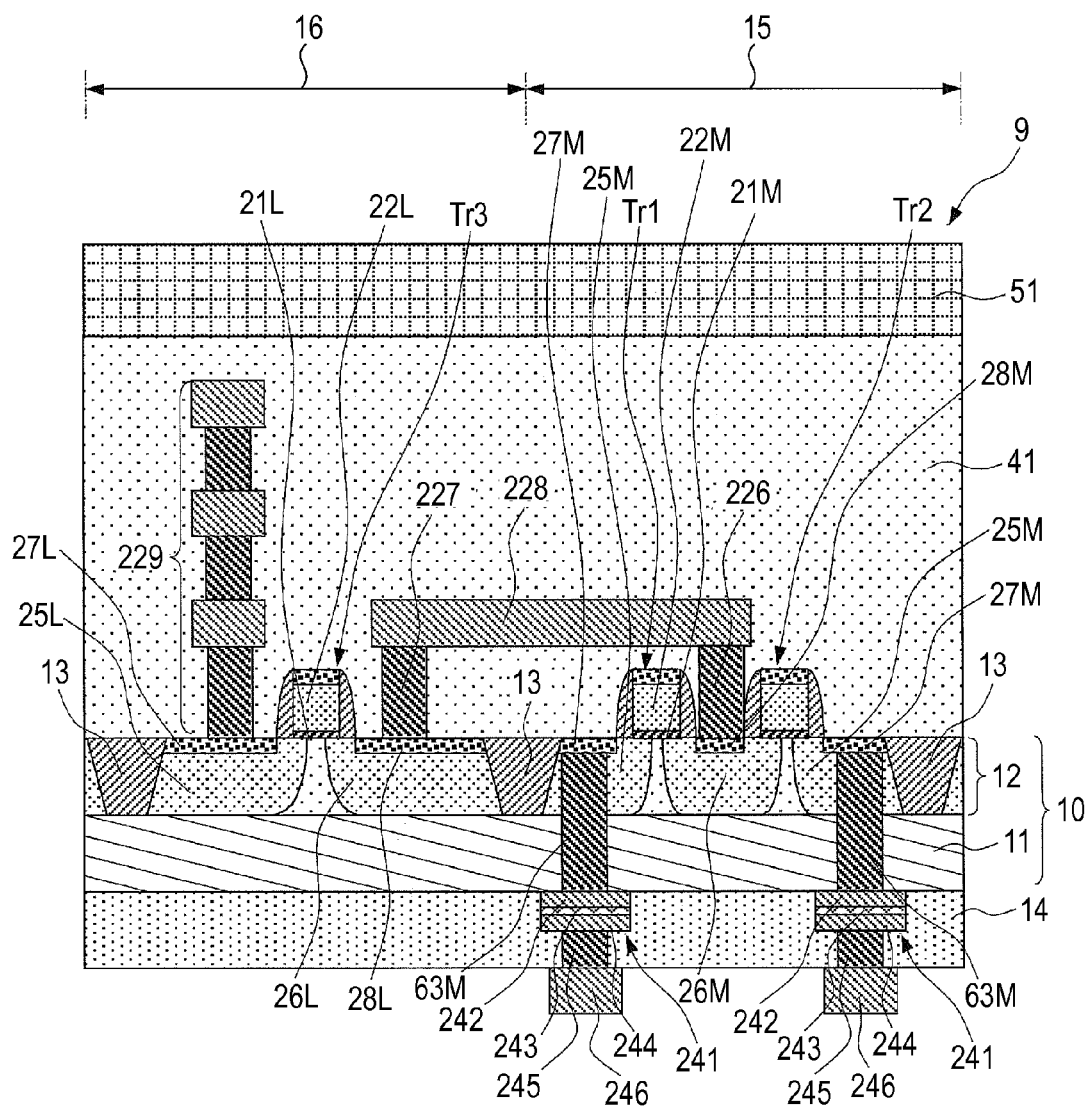
FIG. 8 is a schematic sectional view showing a ninth example of the configuration of the semiconductor device according to the second embodiment of the invention.

Next, a ninth example of the configuration of the semiconductor device according to the second embodiment of the invention will be described with reference to a schematic sectional view of FIG. 8. FIG. 8 shows an example where a resistance-change memory element serving as a memory element is formed on the rear surface of the substrate 10.

As shown in FIG. 8, a substrate 10 has a semiconductor area 12 formed on the first insulating film 11. The first insulating film 11 is formed of, for example, a silicon nitride (SiN) film, silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device. The semiconductor area 12 is formed of, for example, a silicon layer.

The semiconductor area 12 has an element isolation area 13 for separating a memory element part 15 and a logic element part 16. The element isolation area 13 has, for example, an STI (Shallow Trench Isolation) structure and is formed by filling an element isolation groove formed in the semiconductor area 12 with silicon oxide.

A first field effect transistor Tr1 and a second field effect transistor Tr2 that share a single diffusion layer are formed to be adjacent to each other in the semiconductor area 12 of the memory element part 15. A third field effect transistor Tr3 is formed in the semiconductor area 12 of the logic element part 16.

The first and second field effect transistors Tr1 and Tr2 each have a gate electrode 22M formed on the front surface of the semiconductor area 12 through a gate insulating film 21M. Diffusion layers 25M and 26M that become source and drain areas are formed in the semiconductor area 12 on both sides of the gate electrode 22M. The diffusion layer 26M is shared. Low-resistance parts 27M and 28M are respectively formed at the front surfaces of the diffusion layers 25M and 26M. The semiconductor area 12 between the diffusion layers 25M and 26M on one side (the left side in the drawing) becomes a channel area of the first field effect transistor Tr1. The semiconductor area 12 between the diffusion layers 25M and 26M on the other side (the right side in the drawing) becomes a channel area of the second field effect transistor Tr2.

The gate insulating film 21M, the gate electrode 22M, and the low-resistance parts 27M and 28M are made of the same materials as the gate insulating film, the gate electrode, and the low-resistance parts of the semiconductor device 1.

The third field effect transistor Tr3 has a gate electrode 22L formed on the front surface of the semiconductor area 12 through a gate insulating film 21L. Diffusion layers 25L and 26L that become source and drain areas are formed in the semiconductor area 12 on both sides of the gate electrode 22L. Low-resistance parts 27L and 28L are respectively formed at the front surfaces of the diffusion layers 25L and 26L. A portion of the semiconductor area 12 between the diffusion layers 25L and 26L becomes a channel area of the third field effect transistor Tr3.

The gate insulating film 21L, the gate electrode 22L, and the low-resistance parts 27L and 28L are made of the same materials as the gate insulating film, the gate electrode, and the low-resistance parts of the semiconductor device 1.

An insulating interlayer 41 is formed on the front surface of the semiconductor area 12 so as to cover the first field effect transistor Tr1, the second field effect transistor Tr2, the third field effect transistor Tr3, and the like. The insulating interlayer 41 is formed so as to have a thickness of, for example, several hundred nm or more, and the surface thereof is planarized.

A support substrate 51 is formed on the insulating interlayer 41.

A rear contact electrode 63M is formed in the first insulating film 11 so as to be connected to the diffusion layer 26M. A ferroelectric memory element 241 is formed so as to be connected to the rear contact electrode 63M.

The ferroelectric memory element 241 is formed by laminating a first electrode 242, a ferroelectric film 243, and a second electrode 244.

The first electrode 242 facing the rear contact electrode 63M is made of, for example, platinum (Pt).

The ferroelectric film 243 is made of lead zirconate titanate (PZT: $Pb(Zr,Ti)O_3$), strontium bismuth tantalate (SBT: $SrBi_2Ta_2O_9$), lanthanum bismuth titanate (BLT: $(Bi,La)_4Ti_3O_{12}$), or the like.

The second electrode 244 is made of, for example, iridium oxide ($IrO_2$).

The respective materials are examples and may be appropriately changed.

The diffusion layer 25M and the first electrode 242 pass through the first insulating film 11 and the diffusion layer 25M and are electrically connected to each other by the rear contact electrode 63M connected to the rear surface of the low-resistance part 27M.

A second insulating film 14 is formed so as to bury the ferroelectric memory element 241, and the second electrode 244 is formed on the contact electrode 245 connected to the ferroelectric memory element 241. An interconnect 246 is formed in the second insulating film 14 so as to be connected to the contact electrode 245.

A contact electrode 226 is connected to the diffusion layer 26M of the first field effect transistor Tr1, and a contact electrode 227 is connected to the diffusion layer 26L of the third field effect transistor Tr3. The contact electrodes 226 and 227 are connected to each other by an interconnect 228. Thus, the diffusion layer 26M of the first field effect transistor Tr1 is electrically connected to the diffusion layer 26L of the third field effect transistor Tr3. A multilayer interconnect part 229 formed by laminating contact electrodes and interconnects in multiple layers (three layers in the drawing) is connected to the diffusion layer 25L of the third field effect transistor Tr3.

In the semiconductor device 9, when the ferroelectric memory element 241 is mounted on a logic device, the ferroelectric memory element 241 that was formed on an uppermost interconnect in the related art can be arranged on the rear surface. Therefore, the rules for miniaturization can be applied, so a high-capacity memory can be easily formed.

The ferroelectric memory element 241 and the first field effect transistor Tr1 serving as an access transistor can be connected to each other at the shallow rear contact electrode 63M. Therefore, reduction in contact resistance, improvement in MOSFET performance, and improvement in yield of contact electrodes are achieved.

3. Third Embodiment

[First Example of Method of Manufacturing Semiconductor Device]

A first example of a method of manufacturing a semiconductor device according to a third embodiment of the invention will be described with reference to process sectional views of FIGS. 9 to 11. This manufacturing method is a manufacturing method relative to the first example of the first embodiment.

Figure 9:
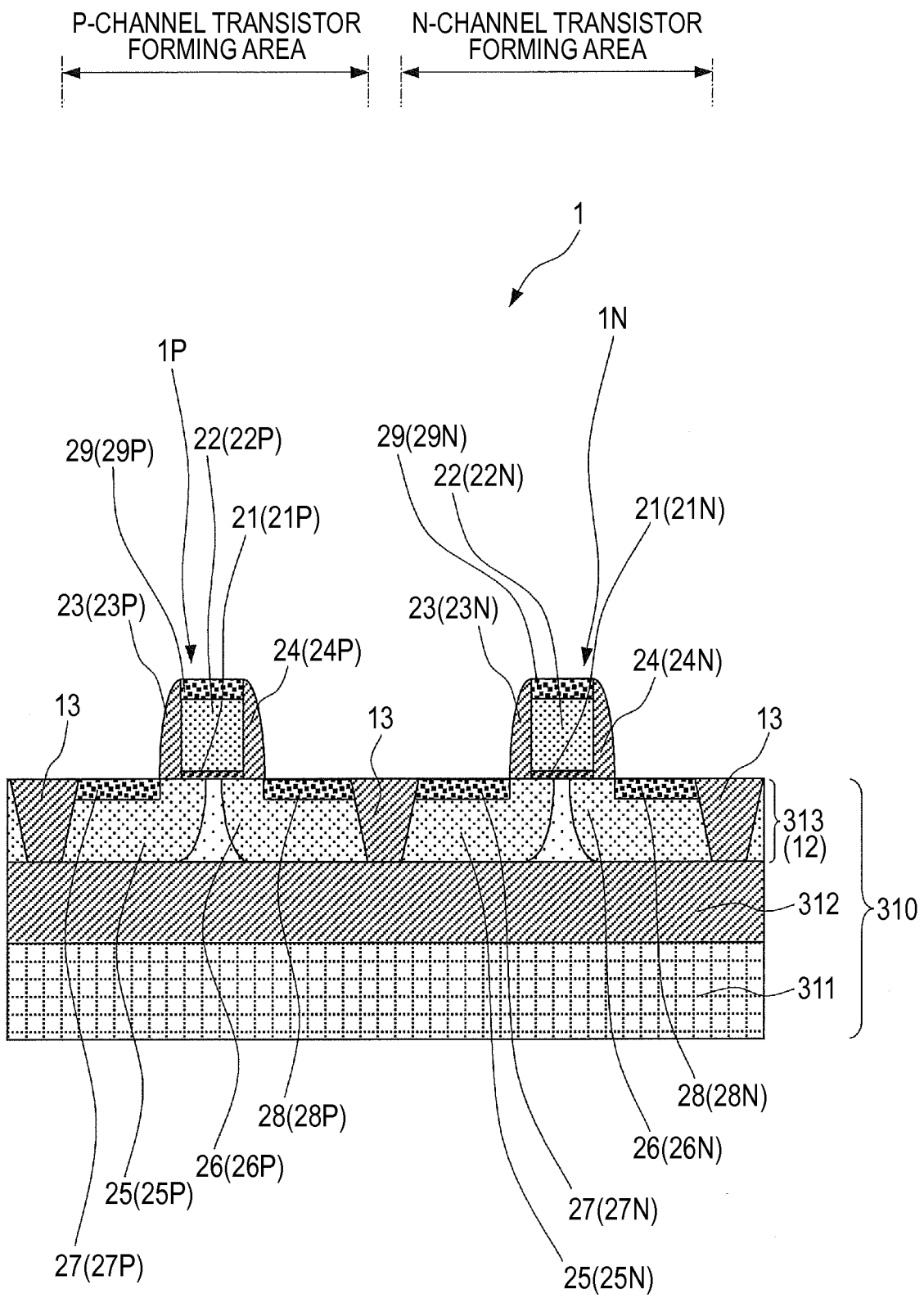
FIG. 9 is a process sectional view showing a first example of a method of manufacturing a semiconductor device according to a third embodiment of the invention.

As shown in FIG. 9, an SOI substrate 310 is used in which a silicon layer 313 (corresponding to the semiconductor area 12) is formed on a first support substrate 311 through an insulating layer 312.

A P-channel transistor and an N-channel transistor are formed by a typical transistor forming process.

First, the element isolation area 13 for separating the P-channel transistor forming area and the N-channel transistor forming area from each other is formed in the semiconductor area 12.

Next, the gate electrode 22 (22P, 22N) is formed on the semiconductor area 12 through the gate insulating film 21 (21P, 21N). When the gate insulating films 21P and 21N are formed with varying thickness, the gate insulating films are formed by different processes. The gate insulating film 21 is formed of, for example, a thermal oxynitride film formed by thermal oxidization, plasma oxidization, or a plasma nitriding method. Alternatively, as the method of forming the insulating film 21, a MOCVD method or ALD method may be used. The term "MOCVD" is an abbreviation of Metal-Organic Chemical Vapor Deposition. The term "ALD" is an abbreviation of Atomic Layer Deposition.

The gate insulating film 21 is formed of, for example, a so-called high-dielectric-constant (High-k) film of hafnium oxide ($HfO_2$), hafnium nitride silicate (HfSiON), zirconium oxide ($ZrO_2$), zirconium nitride silicate (ZrSiON), or the like. Alternatively, the gate insulating film 21P is formed of a composite film of a thermal oxynitride film and the high-dielectric-constant film.

The gate electrode 22 is made of, for example, polysilicon. Alternatively, the gate electrode 22 is made of titanium nitride (TiN), tantalum carbide (TaC), tungsten (W), or the like.

Next, though not shown, an LDD (Lightly Doped Drain) area may be formed. In this case, when an LDD area of the P-channel transistor forming area is formed, the N-channel transistor forming area is masked with resist or the like, and ion implantation is performed so as to form the LDD area of the P-channel transistor. Thereafter, the mask used for the ion implantation is removed. Next, when an LDD area of the N-channel transistor forming area is formed, the P-channel transistor forming area is masked with resist or the like, and ion implantation is performed so as to form the LDD area of the N-channel transistor. Thereafter, the mask used for the ion implantation is removed. Any one of the LDD areas may be formed earlier.

Next, the sidewalls 23 (23P, 23N) and 24 (24P, 24N) are formed at the sidewalls of the gate electrode 22. Typically, the sidewalls are formed so as to surround the gate electrode 22, so the sidewalls 23 and 24 are formed continuously. The sidewalls 23 and 24 are made of, for example, silicon oxide ($SiO_2$), silicon nitride (SiN), silicon oxynitride (SiON), or the like. Alternatively, the sidewalls 23 and 24 may be formed of composite films of these materials.

Next, the N-channel transistor forming area is masked with resist or the like, and ion implantation of a P-type impurity is performed so as to form the diffusion layers 25 (25P) and 26 (26P) of the P-channel transistor. Thereafter, the mask used for the ion implantation is removed. Next, the P-channel transistor forming area is masked with resist or the like, and ion implantation of an N-type impurity is performed so as to form the diffusion layers 25 (25N) and 26 (26N) of the N-channel transistor. Thereafter, the mask used for the ion implantation is removed.

Next, the low-resistance parts 27 and 28 having resistance lower than the diffusion layers 25 and 26 are respectively formed of silicide layers at the front surfaces of the diffusion layers 25 and 26 by a typical siliciding process. It is known that the silicide layer has resistance lower than the diffusion layer formed by implanting ions in the silicon layer. The silicide layers are made of, for example, metal silicide of cobalt (Co), nickel (Ni), platinum (Pt), tantalum (Ta), titanium (Ti), or the like.

When the gate electrode 22 is made of polysilicon, a low-resistance part 29 (29P, 29N) is formed at the upper part of the gate electrode 22 simultaneously with the low-resistance parts 27 and 28.

Thus, the semiconductor device 1 having the P-channel transistor 1P and the N-channel transistor 1N is formed.

Figure 10:
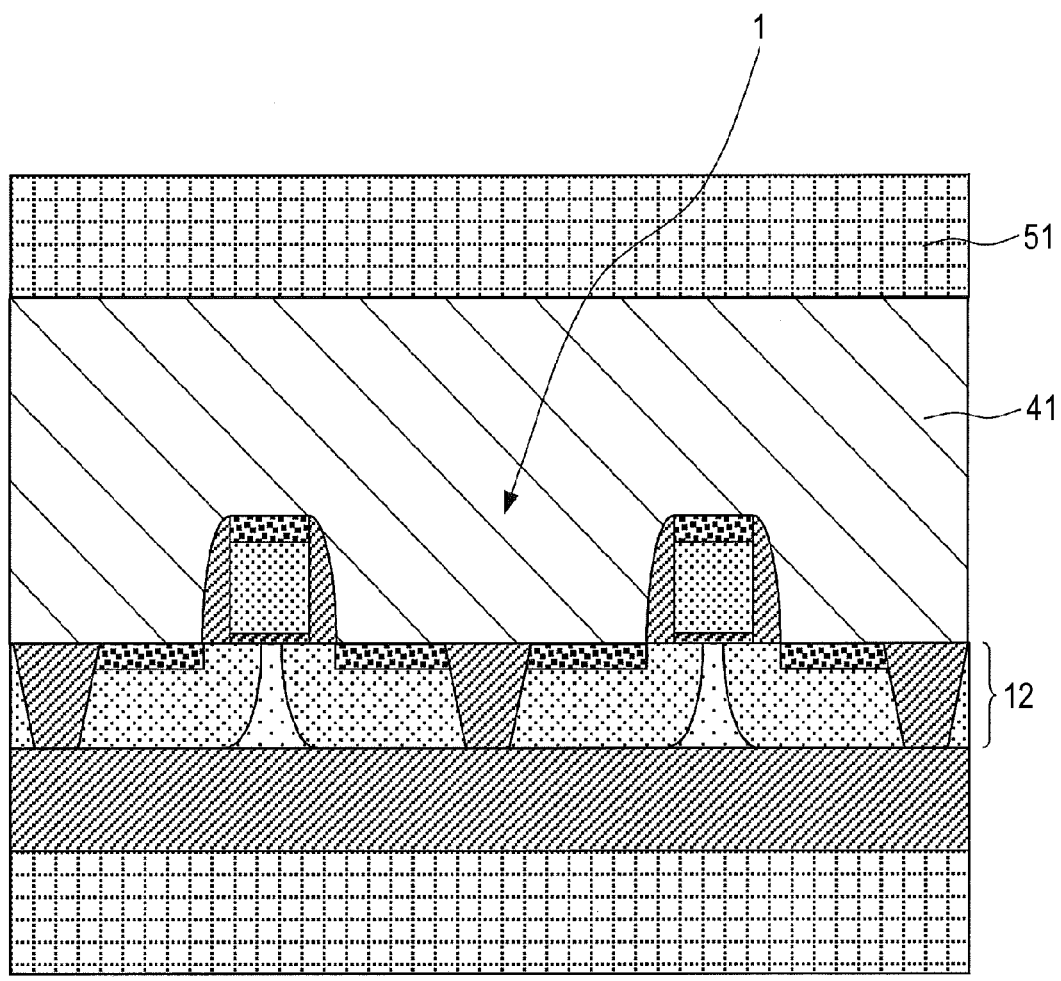
FIG. 10 is a process sectional view showing the first example of the method of manufacturing a semiconductor device according to the third embodiment of the invention.

Next, as shown in FIG. 10, an insulating interlayer 41 is formed on the semiconductor area 12 so as to cover the semiconductor device 1. The insulating interlayer 41 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the insulating interlayer 41 is formed of an insulating film, such as an organic insulating film or the like, made of a material for an insulating interlayer of a typical semiconductor device. Thereafter, the surface of the insulating interlayer 41 is planarized.

Next, the support substrate 51 is stacked on the insulating interlayer 41. Examples of the support substrate 51 include a silicon substrate, a glass substrate, a plastic substrate, and the like.

Figure 11:
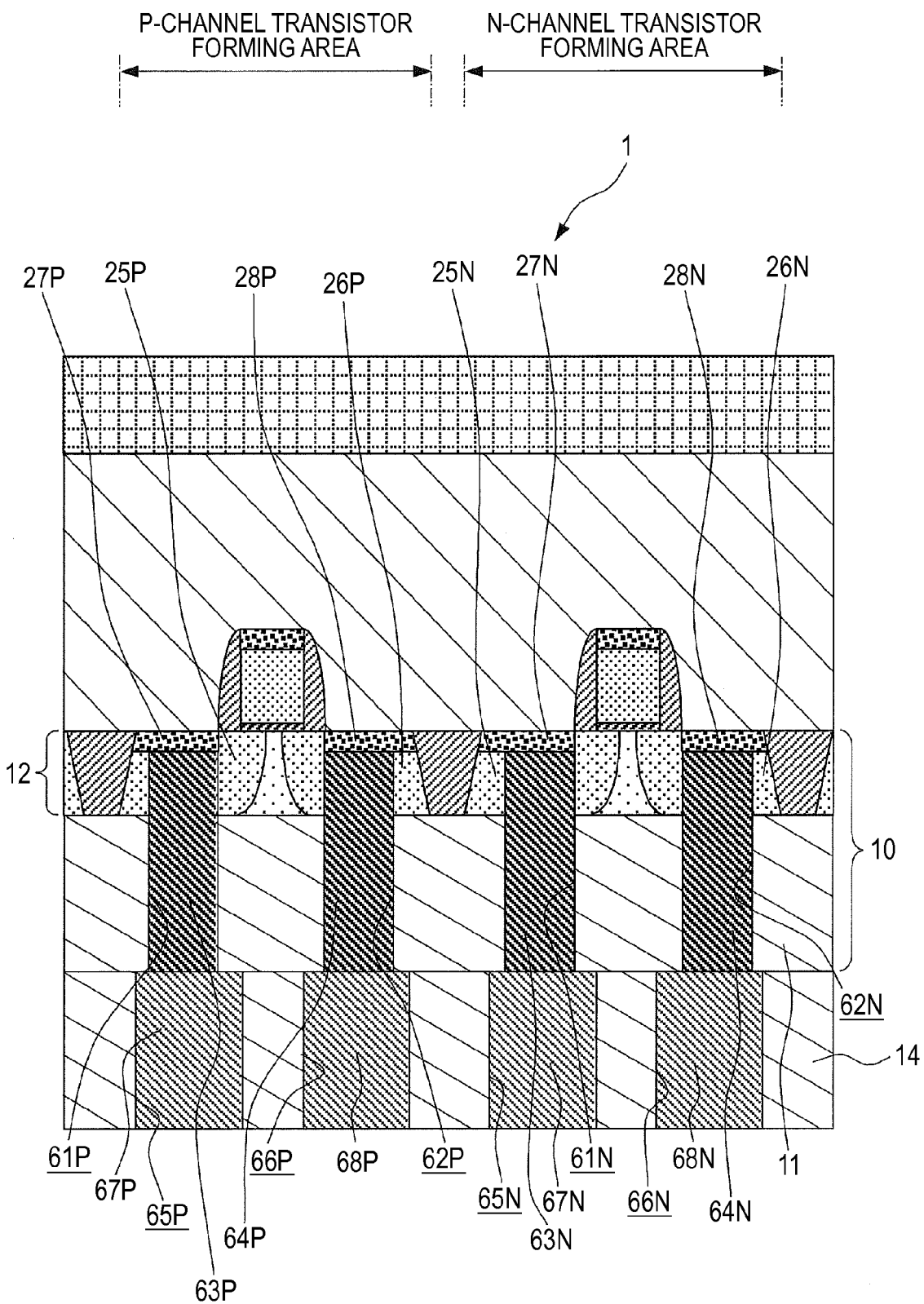
FIG. 11 is a process sectional view showing the first example of the method of manufacturing a semiconductor device according to the third embodiment of the invention.

Next, as shown in FIG. 11, the first insulating film 11 is formed on the rear surface of the semiconductor area 12. Thus, the substrate 10 is formed in which the semiconductor area 12 is formed on the first insulating film 11. The first insulating film 11 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device.

Next, the contact holes 61P and 62P are formed in the first insulating film 11 so as to communicate with the diffusion layers 25P and 26P, respectively, by typical lithography and etching techniques. The contact holes 61P and 62P respectively pass through the diffusion layers 25P and 26P and reach the rear surfaces of the low-resistance parts 27P and 28P.

Simultaneously, the contact holes 61N and 62N are formed in the first insulating film 11 so as to communicate with the diffusion layers 25N and 26N, respectively. The contact holes 61N and 62N respectively pass through the diffusion layers 25N and 26N and reach the rear surfaces of the low-resistance parts 27N and 28N.

Next, the rear contact electrodes 63P and 64P are respectively formed in the contact holes 61P and 62P so as to be connected to the rear surfaces of the low-resistance parts 27P and 28P. Simultaneously, the rear contact electrodes 63N and 64N are respectively formed in the contact holes 61N and 62N so as to be connected to the rear surfaces of the low-resistance parts 27N and 28N. The rear contact electrodes 63P and 64P and the rear contact electrodes 63N and 64N are respectively formed by filling the contact holes 61P and 62P and the contact holes 61N and 62N with metal materials. Examples of the metal materials include titanium (Ti), titanium nitride (TiN), tantalum (Ta), tantalum nitride (TaN), tungsten (W), copper (Cu), and the like.

Next, the second insulating film 14 is formed at the first insulating film 11. The second insulating film 14 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the second insulating film 14 is formed of an insulating film, such as an organic insulating film or the like, made of a material for an insulating interlayer of a typical semiconductor device.

Next, the interconnect grooves 65P and 66P are formed in the second insulating film 14 so as to communicate with the rear contact electrodes 63P and 64P, respectively, by typical lithography and etching techniques. The interconnect grooves 65P and 66P respectively reach the rear contact electrodes 63P and 64P. Simultaneously, the interconnect grooves 65N and 66N are formed in the second insulating film 14 so as to communicate with the rear contact electrodes 63N and 64N, respectively. The interconnect grooves 65N and 66N respectively reach the rear contact electrodes 63N and 64N.

Next, the interconnects 67P and 68P are respectively formed in the interconnect grooves 65P and 66P so as to be connected to the rear contact electrodes 63P and 64P by a typical interconnect forming process. Simultaneously, the interconnects 67N and 68N are respectively formed in the interconnect grooves 65N and 66N so as to be connected to the rear contact electrodes 63N and 64N. The interconnects 67P, 68P, 67N, and 68N are respectively formed by filling the interconnect grooves 65P, 66P, 65N, and 66N with metal materials or composite films thereof. Examples of the metal materials include titanium (Ti), titanium nitride (TiN), tantalum (Ta), tantalum nitride (TaN), ruthenium (Ru), copper (Cu), and the like.

Though not shown, an N-th (where N≥2) interconnect and an (N−1)th rear contact electrode connecting the N-th layered interconnect and an (N−1)th interconnect may be formed. That is, the interconnect may be formed in the form of a multilayer interconnect.

In the method of manufacturing the semiconductor device 1, the rear contact electrodes 63P, 64P, 63N, and 64N are respectively connected directly to the low-resistance parts 27P, 28P, 27N, and 28N through the diffusion layers 25P, 26P, 25N, and 26N. Therefore, the contact resistance value between the rear contact electrode 63P and the diffusion layer 25P is reduced. Similarly, the contact resistance values between the rear contact electrodes 64P, 63N, and 64N and the diffusion layers 26P, 25N, and 26N are reduced. That is, the contact resistance values between the rear contact electrodes 63P, 64P, 63N, and 64N and the diffusion layers 25P, 26P, 25N, and 26N are identical to the contact resistance values between front contact electrodes (not shown) connected to the low-resistance parts 27P, 28P, 27N, and 28N formed at the front surfaces of the diffusion layers 25P, 26P, 25N, and 26N from the front surface and the diffusion layers 25P, 26P, 25N, and 26N.

Therefore, the contact electrode that was formed on the gate electrode 22 in the related art will not be formed, so parasitic capacitance between the gate electrode 22 and the rear contact electrodes 63P, 64P, 63N, and 64N is reduced.

Even though the distance between the gate electrode 22 and the contact electrodes is reduced in terms of planar layout with element miniaturization, the gate electrode 22 can be reliably insulated from the rear contact electrodes 63P, 64P, 63N, and 64N.

The miniaturization of the contact electrodes are facilitated with a small aspect ratio of the rear contact electrodes 63P, 64P, 63N, and 64N.

Even when a so-called stress liner film (not shown) is provided on the transistor so as to improve mobility, the stress liner film is not disconnected by the contact electrodes, so loss of a stress effect of the stress liner film is small. The stress liner film (CSIL: Channel Stress Induced Liner) is typically formed of a silicon nitride film having tensile stress or compressive stress.

[Second Example of Method of Manufacturing Semiconductor Device]

Next, a second example of the method of manufacturing a semiconductor device according to the third embodiment of the invention will be described with reference to a process sectional view of FIG. 12. The second example is a manufacturing method relative to the second example of the semiconductor device of the first embodiment.

Figure 12:
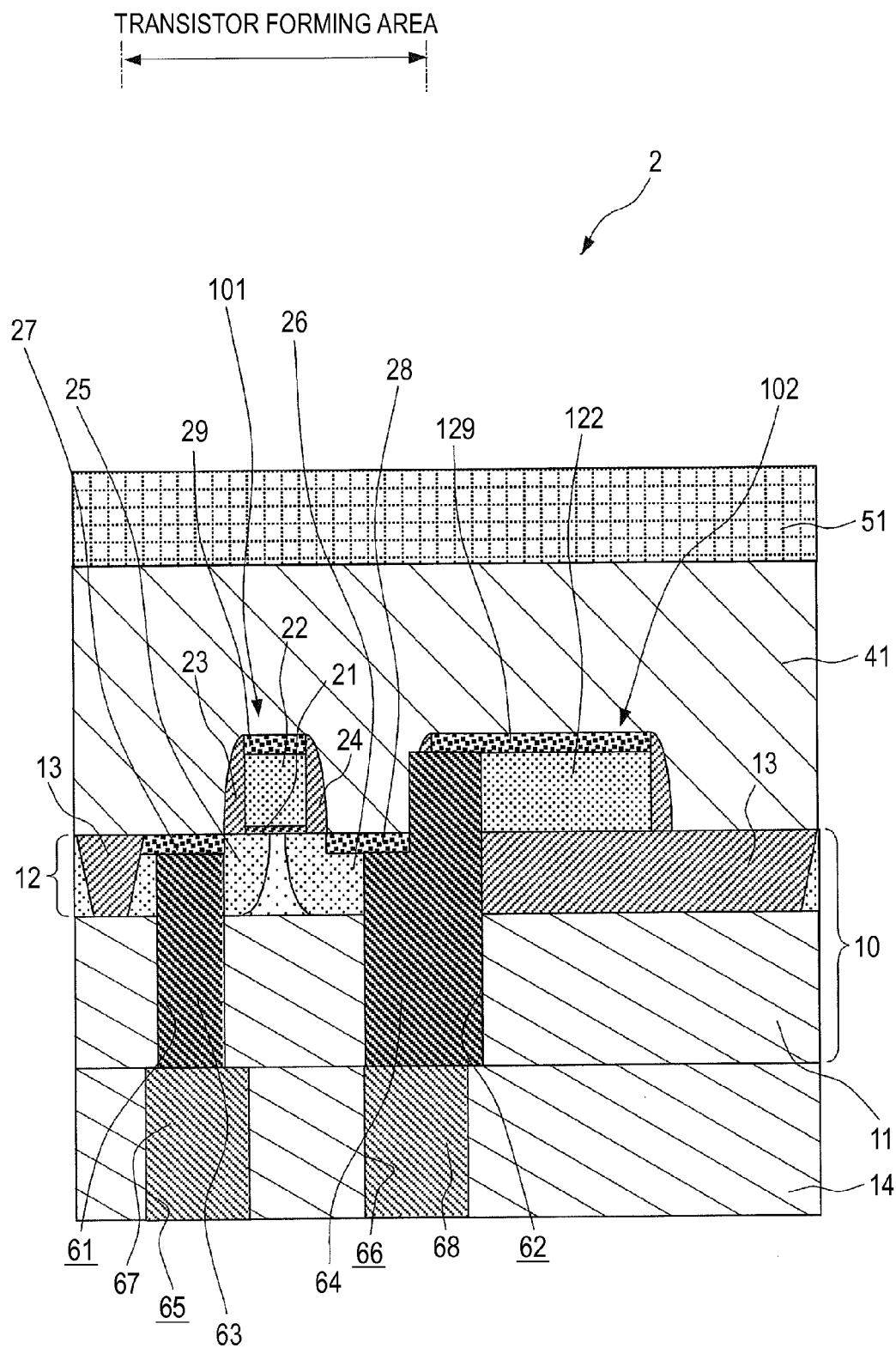
FIG. 12 is a process sectional view showing a second example of the method of manufacturing a semiconductor device according to the third embodiment of the invention.

As shown in FIG. 12, the element isolation area 13 for separating a transistor forming area in the semiconductor area 12 is formed with the silicon layer of the SOI substrate as the semiconductor area 12. Then, the first transistor 101, for example, a P-channel transistor or an N-channel transistor is formed in the transistor forming area of the semiconductor area 12 by a typical transistor forming process.

Specifically, the gate electrode 22 is formed on the transistor forming area of the semiconductor area 12 through the gate insulating film 21.

The gate insulating film 21 is formed of, for example, a so-called high-dielectric-constant (High-k) film of hafnium oxide ($HfO_2$), hafnium nitride silicate (HfSiON), zirconium oxide ($ZrO_2$), zirconium nitride silicate (ZrSiON), or the like. Alternatively, the gate insulating film 21 is formed of a composite film of a thermal oxynitride film and the high-dielectric-constant film.

The gate electrode 22 is made of, for example, polysilicon.

Next, the sidewalls 23 and 24 are formed at the sidewalls of the gate electrode 22. The sidewalls 23 and 24 are made of, for example, silicon oxide ($SiO_2$), silicon nitride (SiN), silicon oxynitride (SiON), or the like. Alternatively, the sidewalls 23 and 24 are formed of composite films of these materials. Before the sidewalls 23 and 24 are formed, LDD (Lightly Doped Drain) areas may be formed in the semiconductor area 12 on both sides of the gate electrode 22.

The diffusion layers 25 and 26 are formed in the semiconductor area 12 on both sides of the gate electrode 22 by an ion implantation method. The diffusion layers 25 and 26 are formed by ion-implanting a P-type impurity in the case of a P-channel transistor or by ion-implanting an N-type carbon fluoride ($CF_x$) in the case of an N-channel transistor, and form source and drain areas. The semiconductor area 12 between the diffusion layers 25 and 26 becomes a channel area.

Next, the low-resistance parts 27 and 28 having resistance (electrical resistance) lower than the diffusion layers 25 and 26 are formed of silicide at the front surfaces of the diffusion layers 25 and 26 by a typical siliciding process. The silicide layers are made of, for example, metal silicide of cobalt (Co), nickel (Ni), platinum (Pt), tantalum (Ta), titanium (Ti), or the like.

Simultaneously, the low-resistance part 29 is formed at the upper part of the gate electrode 22.

In this way, the first transistor 101 is formed in the semiconductor area 12.

The second transistor 102 is formed on the element isolation area 13 by the same process as the first transistor 101 simultaneously, and a part of the gate electrode 122 of the second transistor 102 is formed on the element isolation area 13. The gate electrode 122 is made of polysilicon. The low-resistance part 129 is formed of the same silicide layer as described above at the upper part of the gate electrode 122 at the same time the low-resistance parts 27 and 28 are formed.

In this way, the semiconductor device 2 having the first transistor 101 and the second transistor 102 is formed.

Next, the insulating interlayer 41 is formed on the semiconductor area 12 so as to cover the semiconductor device 2. The insulating interlayer 41 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the insulating interlayer 41 is formed of an insulating film, such as an organic insulating film or the like, made of a material for an insulating interlayer of a typical semiconductor device. Thereafter, the surface of the insulating interlayer 41 is planarized.

The support substrate 51 is stacked on the insulating interlayer 41. Examples of the support substrate 51 include a silicon substrate, a glass substrate, a plastic substrate, and the like.

Next, though not shown, the first support substrate and the insulating layer of the SOI substrate are removed so as to expose the rear surface of the semiconductor area 12.

Next, the first insulating film 11 is formed on the rear surface of the semiconductor area 12. Thus, the substrate 10 is formed in which the semiconductor area 12 is formed on the first insulating film 11. The first insulating film 11 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device.

Next, the contact holes 61 and 62 are formed in the first insulating film 11 so as to communicate with the diffusion layers 25 and 26, respectively, by typical lithography and etching techniques. The contact holes 61 and 62 respectively pass through the diffusion layers 25 and 26 and reach the rear surfaces of the low-resistance parts 27 and 28. Of these, the contact hole 62 further reaches the rear surface of the low-resistance part 29 of the gate electrode 22. Next, the rear contact electrodes 63 and 64 are respectively formed in the contact holes 61 and 62 so as to be connected to the rear surfaces of the low-resistance parts 27 and 28. Of these, the rear contact electrode 64 is connected to the low-resistance part 28 of the diffusion layer 26 and the low-resistance part 29 of the gate electrode 22. The rear contact electrodes 63 and 64 are respectively formed by filling the contact holes 61 and 62 with metal materials, for example, titanium (Ti), titanium nitride (TiN), tantalum (Ta), tantalum nitride (TaN), tungsten (W), copper (Cu), or the like.

Next, the second insulating film 14 is formed at the first insulating film 11. The second insulating film 14 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the second insulating film 14 is formed of an insulating film, such as an organic insulating film or the like, made of a material for an insulating interlayer of a typical semiconductor device.

Next, the interconnect grooves 65 and 66 are formed in the second insulating film 14 so as to reach the rear contact electrodes 63 and 64, respectively, by typical lithography and etching techniques.

Next, the interconnects 67 and 68 are respectively formed in the interconnect grooves 65 and 66 so as to be connected to the rear contact electrodes 63 and 64 by a typical interconnect forming process. The interconnects 67 and 68 are respectively formed by filling the interconnect grooves 65 and 66 with metal materials, for example, titanium (Ti), titanium nitride (TiN), tantalum (Ta), tantalum nitride (TaN), ruthenium (Ru), copper (Cu), or the like, or composite films thereof.

Though not shown, an N-th (where $N \geq 2$) interconnect and an (N−1)th rear contact electrode connecting the N-th layered interconnect and an (N−1)th interconnect may be formed. That is, the interconnect may be formed in the form of a multilayer interconnect.

In the method of manufacturing the semiconductor device 2, a so-called shared contact electrode structure can be formed. Even in the shared contact electrode structure, the same advantages as the method of manufacturing the semiconductor device 1 are obtained.

[Third Example of Method of Manufacturing Semiconductor Device]

Next, a third example of the method of manufacturing a semiconductor device according to the third embodiment of the invention will be described with reference to process sectional views of FIGS. 13A to 13B. The third example is a manufacturing method in which, in the first example of the method of manufacturing a semiconductor device, the sidewalls are formed and then removed so as to form spaces. The third example is a manufacturing method relative to the third example of the semiconductor device of the first embodiment.

As shown in FIG. 13A, similarly to the first example of the method of manufacturing a semiconductor device, the P-channel transistor 1P and the N-channel transistor 1N are formed in the semiconductor area 12 of the SOI substrate 310.

That is, the gate electrode 22 (22P, 22N) is formed on the semiconductor area 12 through the gate insulating film 21 (21P, 21N), and the sidewalls 23 and 24 are formed at the sidewalls of the gate electrode 22. The sidewalls 23 and 24 are made of, for example, silicon oxide ($SiO_2$), silicon nitride, silicon oxynitride, or the like. The sidewalls 23 and 24 are formed of composite films of these materials. The diffusion layers 25 (25P, 25N) and 26 (26P, 26N) that become source and drain areas are formed in the semiconductor area 12 on both sides of the gate electrode 22 (22P, 22N).

The low-resistance parts 27 and 28 having resistance lower than the diffusion layers 25 and 26 are formed of silicide layers at the front surfaces of the diffusion layers 25 and 26 by a typical siliciding process. The silicide layers are made of, for example, metal silicide of cobalt (Co), nickel (Ni), platinum (Pt), tantalum (Ta), titanium (Ti), or the like.

Though not shown, when the gate electrode 22 is made of polysilicon, a low-resistance part (not shown) is formed at the upper part of the gate electrode 22 simultaneously with the low-resistance parts 27 and 28.

Next, the first insulating interlayer 42 is formed on the semiconductor area 12 so as to cover the P-channel transistor 1P and the N-channel transistor 1N. Thereafter, the upper part of the first insulating interlayer 42 is polished such that the upper parts of the gate electrode 22 and the sidewalls 23 and 24 are exposed. The polishing is performed by, for example, chemical mechanical polishing.

Next, as shown in FIG. 13B, the sidewalls 23 and 24 (see FIG. 13A) are removed so as to form the spaces 91P and 92P and the spaces 91N and 92N. When the sidewalls 23 and 24 are formed of, for example, laminated films of a silicon oxide film and a silicon nitride film, one of the films may be removed so as to form the spaces 91P and 92P and the spaces 91N and 92N.

Next, the second insulating interlayer 43 is formed on the first insulating interlayer 42 so as not to fill the spaces 91P and 92P and the spaces 91N and 92N. The second insulating interlayer 43 made of, for example, silicon nitride, silicon oxide, silicon oxycarbide, silicon oxycarbonitride, or the like, or a composite film thereof.

In this way, the first insulating interlayer 42 and the second insulating interlayer 43 form the insulating interlayer 41. The support substrate 51 is stacked on the insulating interlayer 41.

A subsequent manufacturing process is the same as that described with reference to the first example of the method of manufacturing a semiconductor device.

In the method of manufacturing the semiconductor device 3, the spaces 91P and 92P are formed laterally to the gate electrode 22P, and the spaces 91N and 92N are formed laterally to the gate electrode 22N. Therefore, parasitic capacitance can be further reduced. Further, the same advantages as the method of manufacturing the semiconductor device 1 are obtained.

[Fourth Example of Method of Manufacturing Semiconductor Device]

Next, a fourth example of the method of manufacturing a semiconductor device according to the third embodiment of the invention will be described.

In the fourth example of the method of manufacturing a semiconductor device, as shown in FIG. 13A, the spaces 91P and 92P and the spaces 91N and 92N are formed, and then the spaces 91P and 92P and the spaces 91N and 92N are filled with, for example, low-dielectric-constant films having a dielectric constant lower than silicon oxide. Examples of the low-dielectric-constant films include low-dielectric-constant organic film of polyaryl ether, polyparaxylylene, polyaryl ether, or fluorinated polyaryl ether used for an insulating interlayer. Alternatively, an insulating film, such as a silicon oxycarbide (SiOC) film, methylsilsesquioxane (MSQ) or hydrosilsesquioxane (HSQ), a porous film, fluorinated silicon oxide (SiOF), or the like, may be used.

Thereafter, similarly to the third example of the method of manufacturing a semiconductor device, a process for forming the second insulating interlayer 43 and later may be performed.

As described above, if the sidewalls 23P and 24P and the sidewalls 23N and 24N are formed of low-dielectric-constant films, the spaces 91P and 92P and the spaces 91N and 92N are filled, so a rigid structure can be formed and parasitic capacitance can be reduced.

In the first example of the method of manufacturing a semiconductor device, the sidewalls 23 and 24 may be formed of, for example, the low-dielectric-constant films having a dielectric constant lower than silicon oxide. In this case, the low-dielectric-constant films are preferably made of materials which become a mask for ion implantation.

[Fifth Example of Method of Manufacturing Semiconductor Device]

Next, a fifth example of the method of manufacturing a semiconductor device according to the third embodiment of the invention will be described with reference to process sectional views of FIGS. 14 to 16.

Figure 14:
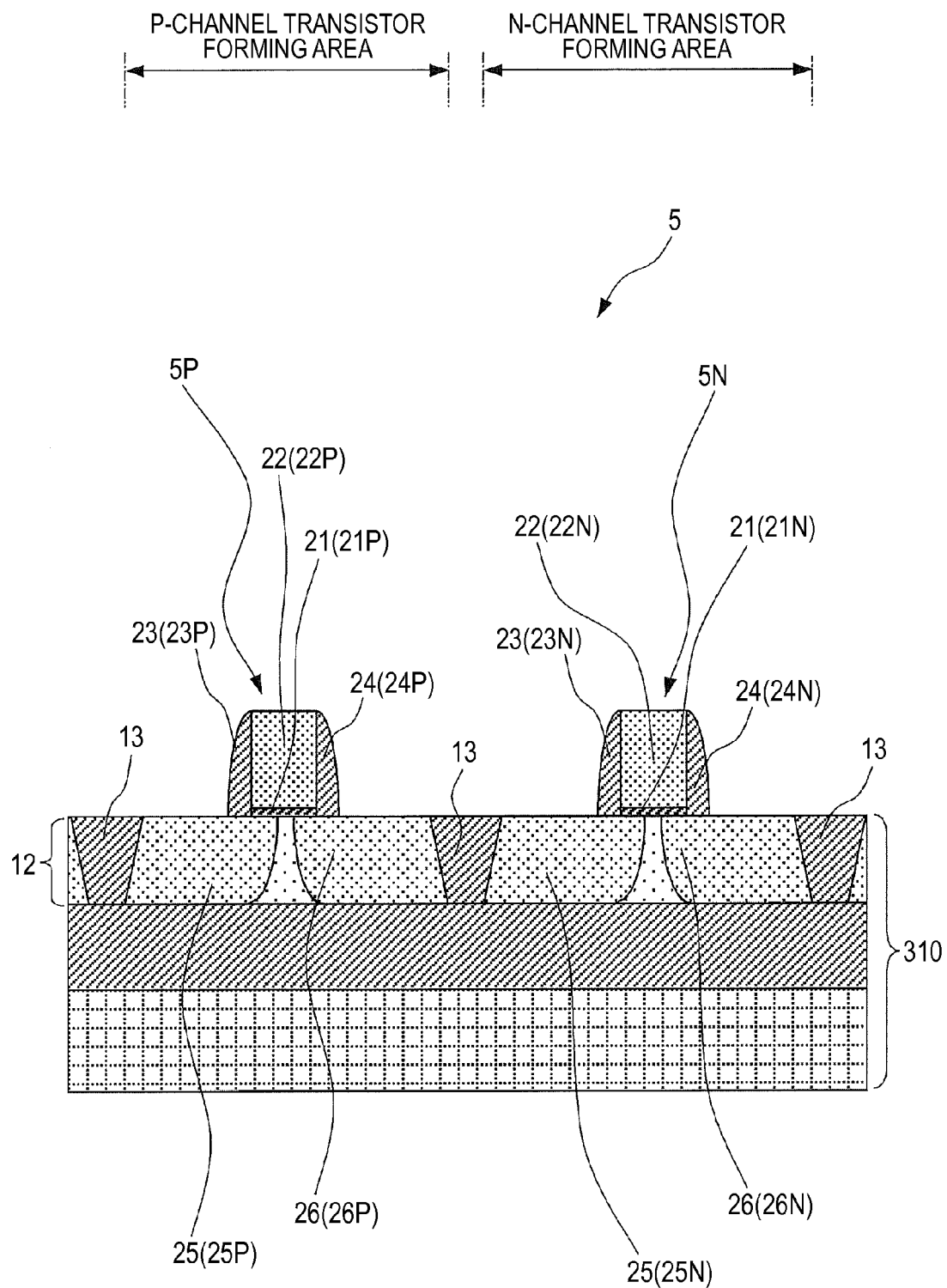
FIG. 14 is a process sectional view showing a fifth example of the method of manufacturing a semiconductor device according to the third embodiment of the invention.

As shown in FIG. 14, similarly to the first example of the method of manufacturing a semiconductor device, the element isolation area 13 for separating the P-channel transistor forming area and the N-channel transistor forming area from each other is formed in the semiconductor area 12 of the SOI substrate 310. Thereafter, the P-channel transistor 5P and the N-channel transistor 5N are formed in the P-channel transistor forming area and the N-channel transistor forming area, respectively.

That is, the gate electrode 22 (22P, 22N) is formed on the semiconductor area 12 through the gate insulating film 21 (21P, 21N), and the sidewalls 23 and 24 are formed at the sidewalls of the gate electrode 22. The sidewalls 23 and 24 are made of, for example, silicon oxide ($SiO_2$), silicon nitride, silicon oxynitride, or the like. Alternatively, the sidewalls 23 and 24 are formed of composite films of these materials. The diffusion layers 25 (25P, 25N) and 26 (26P, 26N) that become source and drain areas are formed in the semiconductor area 12 on both sides of the gate electrode 22 (22P, 22N).

In this way, the semiconductor device 5 having the P-channel transistor 5P and the N-channel transistor 5N is formed.

Figure 15:
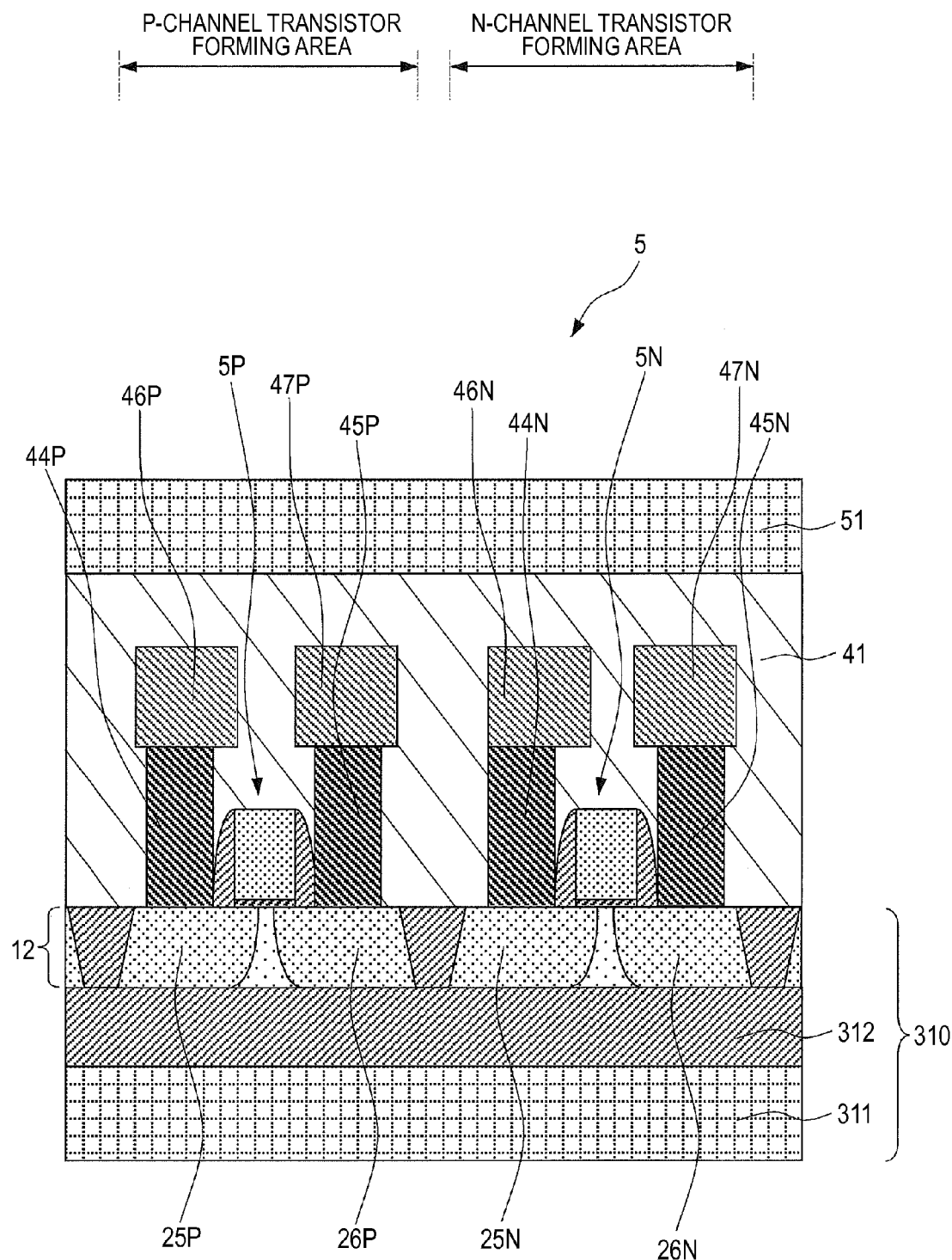
FIG. 15 is a process sectional view showing the fifth example of the method of manufacturing a semiconductor device according to the third embodiment of the invention.

Next, as shown in FIG. 15, the insulating interlayer 41 is formed on the semiconductor area 12 so as to cover the semiconductor device 5. Simultaneously, the electrodes 44P and 45P respectively connected to the front surfaces of the diffusion layers 25P and 26P and the interconnects 46P and 47P respectively connected to the electrodes 44P and 45P are formed. Simultaneously, the electrodes 44N and 45N respectively connected to the front surfaces of the diffusion layers 25N and 26N and the interconnects 46N and 47N respectively connected to the electrodes 44N and 45N are formed.

Specifically, for example, a first insulating interlayer is formed so as to cover the P-channel transistor 5P and the N-channel transistor 5N. Thereafter, contact holes are respectively formed in the first insulating interlayer so as to reach the diffusion layers 25P and 26P and the diffusion layers 25N and 26N, and the electrodes 44P and 45P and the electrodes 44N and 45N are formed in the contact holes.

Next, a second insulating interlayer is formed on the first insulating interlayer. Next, interconnect grooves are respectively formed in the second insulating interlayer so as to be connected to the electrodes 44P and 45P and the electrodes 44N and 45N, and the interconnects 46P and 47P and the interconnects 46N and 47N are formed in the interconnect grooves. A third insulating interlayer is formed on the second insulating interlayer. The surface of the third insulating interlayer is planarized.

In this way, the first to third insulating interlayers form the insulating interlayer 41.

The insulating interlayer 41 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the insulating interlayer 41 is formed of an insulating film, such as an organic insulating film or the like, made of a material for an insulating interlayer of a typical semiconductor device.

Next, the support substrate 51 is stacked on the insulating interlayer 41. Examples of the support substrate 51 include a silicon substrate, a glass substrate, a plastic substrate, and the like.

Thereafter, the first support substrate 311 and the insulating layer 312 of the SOI substrate 310 are removed.

In the drawing, the state before being removed is shown.

Figure 16:
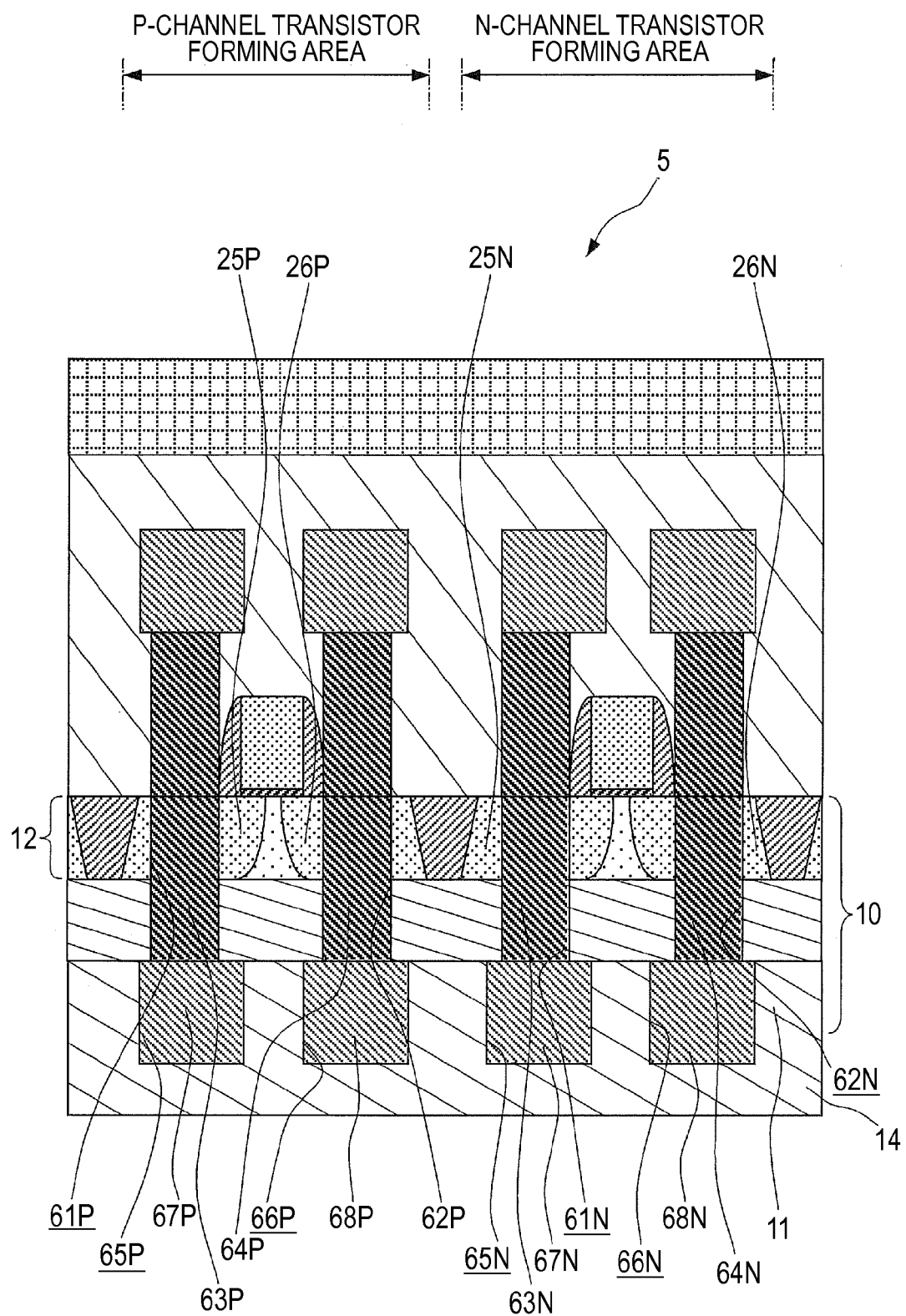
FIG. 16 is a process sectional view showing the fifth example of the method of manufacturing a semiconductor device according to the third embodiment of the invention.

Next, as shown in FIG. 16, the first insulating film 11 is formed on the rear surface of the semiconductor area 12. Thus, the substrate 10 is formed in which the semiconductor area 12 is formed on the first insulating film 11. The first insulating film 11 is formed of, for example, a silicon nitride (SiN) film, a silicon oxide ($SiO_2$) film, a silicon oxycarbide (SiOC) film, a silicon oxycarbonitride (SiOCN) film, or a composite film thereof. Alternatively, the first insulating film 11 is formed of an insulating film, such as an organic insulating film or the like, made of a material for an insulating interlayer of a typical semiconductor device.

Next, the contact holes 61P and 62P are formed in the first insulating film 11 so as to communicate with the diffusion layers 25P and 26P, respectively, by typical lithography and etching techniques. The contact holes 61P and 62P respectively pass through the diffusion layers 25P and 26P and reach the rear surfaces of the electrodes 44P and 45P which become the low-resistance parts.

Simultaneously, the contact holes 61N and 62N are formed in the first insulating film 11 so as to communicate with the diffusion layers 25N and 26N, respectively. The contact holes 61N and 62N respectively pass through the diffusion layers 25N and 26N and reach the rear surfaces of the electrodes 44N and 45N which become the low-resistance parts.

Next, the rear contact electrodes 63P and 64P are respectively formed in the contact holes 61P and 62P so as to be connected to the rear surfaces of the electrodes 44P and 45P. Simultaneously, the rear contact electrodes 63N and 64N are respectively formed in the contact holes 61N and 62N so as to be connected to the rear surfaces of the electrodes 44N and 45N. The rear contact electrodes 63P and 64P and the rear contact electrodes 63N and 64N are respectively formed by filling the contact holes 61P and 62P and the contact holes 61N and 62N with metal materials, for example. Examples of the metal materials include titanium (Ti), titanium nitride (TiN), tantalum (Ta), tantalum nitride (TaN), tungsten (W), copper (Cu), and the like.

Next, the second insulating film 14 is formed at the first insulating film 11. The second insulating film 14 is formed of, for example, a silicon nitride (SiN) film, a silicon oxide (SiO$_2$) film, a silicon oxycarbide (SiOC) film, a silicon oxycarbonitride (SiOCN) film, or a composite film thereof. Alternatively, the second insulating film 14 is formed of an insulating film, such as an organic insulating film or the like, made of a material for an insulating interlayer of a typical semiconductor device.

Next, the interconnect grooves 65P and 66P are formed in the second insulating film 14 so as to communicate with the rear contact electrodes 63P and 64P, respectively, by typical lithography and etching techniques. The interconnect grooves 65P and 66P respectively reach the rear contact electrodes 63P and 64P. Simultaneously, the interconnect grooves 65N and 66N are formed in the second insulating film 14 so as to communicate with the rear contact electrodes 63N and 64N, respectively. The interconnect grooves 65N and 66N respectively reach the rear contact electrodes 63N and 64N.

Next, the interconnects 67P and 68P are respectively formed in the interconnect grooves 65P and 66P so as to be connected to the rear contact electrodes 63P and 64P by a typical interconnect forming process. Simultaneously, the interconnects 67N and 68N are respectively formed in the interconnect grooves 65N and 66N so as to be connected to the rear contact electrodes 63N and 64N. The interconnects 67P, 68P, 67N, and 68N are respectively formed by filling the interconnect grooves 65P, 66P, 65N, and 66N with metal materials or composite films thereof. Examples of the metal materials include titanium (Ti), titanium nitride (TiN), tantalum (Ta), tantalum nitride (TaN), ruthenium (Ru), copper (Cu), and the like.

Though not shown, an N-th (where N≥2) interconnect and an (N−1)th rear contact electrode connecting the N-th layered interconnect and an (N−1)th interconnect may be formed. That is, the interconnect may be formed in the form of a multilayer interconnect.

An interconnect layer on the front surface may have a single layer or multiple layers.

In the method of manufacturing the semiconductor device 5, the rear contact electrodes 63P, 64P, 63N, and 64N are respectively connected directly to the electrodes 45P, 46P, 45N, and 46N through the diffusion layers 25P, 26P, 25N, and 26N. Therefore, for example, the contact resistance value between the rear contact electrode 63P and the diffusion layer 25P is reduced. Similarly, the contact resistance values between the rear contact electrodes 64P, 63N, and 64N and the diffusion layers 26P, 25N, and 26N are reduced. That is, the contact resistance values between the rear contact electrodes 63P, 64P, 63N, and 64N and the diffusion layers 25P, 26P, 25N, and 26N are identical to the contact resistance values between front contact electrodes (not shown) connected to the electrodes 45P, 46P, 45N, and 46N formed at the front surfaces of the diffusion layers 25P, 26P, 25N, and 26N from the front surface and the diffusion layers 25P, 26P, 25N, and 26N.

Therefore, the contact electrodes that were formed on the gate electrodes 22P and 22N in the related art will not be formed, so parasitic capacitance between the gate electrodes 22P and 22N and the rear contact electrodes 63P, 64P, 63N, and 64N is reduced.

Even though the distance between the gate electrodes 22P and 22N and the contact electrode is reduced in terms of planar layout with element miniaturization, the gate electrodes 22P and 22N can be reliably insulated from the rear contact electrodes 63P, 64P, 63N, and 64N.

The miniaturization of the contact electrodes are facilitated with a small aspect ratio of the rear contact electrodes 63P, 64P, 63N, and 64N.

Even when a so-called stress liner film (not shown) is provided on the transistor so as to improve mobility, the stress liner film is not disconnected by the contact electrodes, so loss of a stress effect of the stress liner film is small. The stress liner film (CSIL: Channel Stress Induced Liner) is typically formed of a silicon nitride film having tensile stress or compressive stress.

The present application contains subject matter related to that disclosed in Japanese Priority Patent Application JP 2009-011691 filed in the Japan Patent Office on Jan. 22, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, the method comprising the steps of:

forming a gate electrode on a silicon layer of an SOI substrate, in which the silicon layer is formed on a first support substrate through an insulating layer, through a gate insulating film, and forming diffusion layers in the silicon layer on both sides of the gate electrode so as to form a transistor;

forming low-resistance parts having resistance lower than the diffusion layers at the front surfaces of the diffusion layers;

forming a second support substrate on the silicon layer through an insulating film covering the transistor and removing the first support substrate and the insulating layer; and forming an insulating interlayer on the silicon layer and forming rear contact electrodes in the insulating interlayer and the silicon layer to be connected to the low-resistance parts;

after the gate electrode is formed and before the diffusion layers are formed, forming sidewalls at the sidewalls of the gate electrode;

forming a first insulating film so as to cover the gate electrode and the sidewalls;

exposing the upper parts of the sidewalls;

removing the sidewalls so as to form spaces between the gate electrode and the first insulating film;

forming a second insulating film on the first insulating film while leaving the spaces such that the first insulating film and the second insulating film form the insulating film.

2. A method of manufacturing a semiconductor device, the method comprising:
   a step of forming diffusion layers of a conductivity-type at a surface of a semiconductor substrate, a channel region of the semiconductor substrate being between a first one of the diffusion layers and a second one of the diffusion layers;
   a step of extending a contact electrode through a first insulating layer and into said semiconductor substrate, said first insulating layer being between said semiconductor substrate and a second insulating film;
   a step of placing a first electrically-conductive interconnect within said second insulating film, said contact electrode touching said first one of the diffusion layers and said first electrically-conductive interconnect;
   a step of a placing a second electrically-conductive interconnect within an insulating interlayer, an electrode within the insulating interlayer extending from said first electrically-conductive interconnect to said second electrically-conductive interconnect.

3. The method according to claim 2, further comprising:
   a step of forming a first gate electrode on a gate insulating film, said channel region being between said gate insulating film and said first gate electrode.

4. The method according to claim 3, further comprising:
   a step of forming a low-dielectric-constant film on a sidewall of the first gate electrode, a dielectric constant of the low-dielectric-constant film being lower than silicon oxide.

5. The method according to claim 3, wherein said gate insulating film is a high-dielectric-constant film.

6. The method according to claim 2, wherein said semiconductor substrate is between said first insulating layer and said insulating interlayer.

7. The method according to claim 2, wherein said conductivity-type is n-type.

8. The method according to claim 2, wherein said conductivity-type is p-type.

9. A method of manufacturing a semiconductor device, the method comprising:
   a step of forming diffusion layers of a conductivity-type at a surface of a semiconductor substrate, a channel region of the semiconductor substrate being between a first one of the diffusion layers and a second one of the diffusion layers;
   a step of extending a contact electrode through a first insulating layer and into said semiconductor substrate, said first insulating layer being between said semiconductor substrate and a second insulating film;
   a step of placing a first electrically-conductive interconnect within said second insulating film, said contact electrode touching said first one of the diffusion layers and said first electrically-conductive interconnect;
   a step of forming low-resistance parts at said surface of the semiconductor substrate, said contact electrode touching a first one of the low-resistance parts.

10. The method according to claim 9, wherein said first one of the low-resistance parts is within said first one of the diffusion layers.

11. The method according to claim 9, wherein said first one of low-resistance parts has an electrical resistance lower than said first one of diffusion layers.

12. The method according to claim 9, wherein said first one of low-resistance parts a silicide.

13. The method according to claim 9, wherein a portion of the contact electrode is said first one of the low-resistance parts.

14. The method according to claim 9, wherein said channel region is between a first one of the low-resistance parts and a second one of the low-resistance parts.

15. The method according to claim 14, wherein said second one of the low-resistance parts is within said second one of the diffusion layers.

16. A method of manufacturing a semiconductor device, the method comprising:
   a step of forming diffusion layers of a conductivity-type at a surface of a semiconductor substrate, a channel region of the semiconductor substrate being between a first one of the diffusion layers and a second one of the diffusion layers;
   a step of extending a contact electrode through a first insulating layer and into said semiconductor substrate, said first insulating layer being between said semiconductor substrate and a second insulating film;
   a step of placing a first electrically-conductive interconnect within said second insulating film, said contact electrode touching said first one of the diffusion layers and said first electrically-conductive interconnect;
   a step of forming a first gate electrode on a gate insulating film, said channel region being between said gate insulating film and said first gate electrode;
   a step of forming a second gate electrode on an element isolation area, said contact electrode extending to said second gate electrode through said semiconductor substrate and said element isolation area.

17. The method according to claim 16, wherein said element isolation area is within said semiconductor substrate.

18. The method according to claim 16, wherein said element isolation area is an insulator.

* * * * *